US008268078B2

(12) United States Patent
Suzuki et al.

(10) Patent No.: US 8,268,078 B2
(45) Date of Patent: Sep. 18, 2012

(54) METHOD AND APPARATUS FOR REDUCING PARTICLE CONTAMINATION IN A DEPOSITION SYSTEM

(75) Inventors: Kenji Suzuki, Guilderland, NY (US); Atsushi Gomi, Rennselaer, NY (US); Masamichi Hara, Clifton Park, NY (US); Yasushi Mizusawa, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 966 days.

(21) Appl. No.: 11/377,920

(22) Filed: Mar. 16, 2006

(65) Prior Publication Data

US 2007/0215048 A1   Sep. 20, 2007

(51) Int. Cl.
    C23C 16/00        (2006.01)
(52) U.S. Cl. ........................... 118/715; 118/725
(58) Field of Classification Search .......... 118/715, 118/726
    See application file for complete search history.

(56) References Cited

U.S. PATENT DOCUMENTS

| | | | |
|---|---|---|---|
| 6,270,839 B1 * | 8/2001 | Onoe et al. .............. 427/248.1 |
| 6,302,965 B1 | 10/2001 | Umotoy et al. |
| 6,444,038 B1 * | 9/2002 | Rangarajan et al. ......... 118/715 |
| 6,491,518 B1 * | 12/2002 | Fujikawa et al. ............. 432/241 |
| 6,506,352 B1 * | 1/2003 | Lindfors et al. ........... 423/240 S |
| 6,712,081 B1 * | 3/2004 | Uehara et al. ................. 134/105 |
| 7,178,750 B2 * | 2/2007 | Thiry .............................. 241/40 |
| 2001/0042523 A1 * | 11/2001 | Kesala ............................ 122/6.6 |
| 2002/0020429 A1 * | 2/2002 | Selbrede et al. .............. 134/1.1 |
| 2002/0076492 A1 * | 6/2002 | Loan et al. ............... 427/255.28 |
| 2003/0019428 A1 * | 1/2003 | Ku et al. ......................... 118/715 |
| 2004/0025370 A1 * | 2/2004 | Guenther ........................ 34/576 |
| 2004/0124131 A1 * | 7/2004 | Aitchison et al. ............. 210/252 |
| 2005/0011447 A1 * | 1/2005 | Fink ............................... 118/715 |
| 2005/0070100 A1 * | 3/2005 | Yamasaki et al. ............. 438/685 |
| 2005/0263628 A1 * | 12/2005 | Thiry .............................. 241/39 |
| 2006/0102286 A1 * | 5/2006 | Kim ........................... 156/345.35 |
| 2006/0110530 A1 | 5/2006 | Suzuki et al. |
| 2006/0110918 A1 | 5/2006 | Suzuki |

FOREIGN PATENT DOCUMENTS

| | | | |
|---|---|---|---|
| GB | 2415967 A | | 1/2006 |
| JP | 1015936 | * | 1/1989 |
| JP | 2003338492 | * | 11/2003 |
| JP | 20033389492 A1 | | 11/2003 |
| WO | WO2004/007793 A | | 1/2004 |

OTHER PUBLICATIONS

A. Roth, Vacuum Technology §§2.4, 3.1.3, 3.3.4, and 3.6.5 (North-Holland, Elsevier Science B.V.) (1990).

European Patent Office, Search Report & Written Opinion, from corresponding PCT/US07/063285.

(Continued)

*Primary Examiner* — Ram Kackar
*Assistant Examiner* — Satish Chandra
(74) *Attorney, Agent, or Firm* — Wood, Herron & Evans, LLP

(57) ABSTRACT

A method and system is described for reducing particle contamination of a substrate in a deposition system. The deposition system comprises one or more particle diffusers disposed therein and configured to prevent or partially prevent the passage of film precursor particles, or break-up or partially break-up film precursor particles. The particle diffuser may be installed in the film precursor evaporation system, or the vapor delivery system, or the vapor distribution system, or two or more thereof.

18 Claims, 14 Drawing Sheets

OTHER PUBLICATIONS

Chinese Patent Office, Office Action in Chinese Patent Application No. 200780009285.3, dated May 26, 2011.
U.S. Patent and Trademark Office, Office Action in related U.S. Appl. No. 11/377,237, dated Apr. 20, 2009, 15 pp.
State Intellectual Property Office of the People's Republic of China, The First Office Action, in corresponding Chinese Patent Application No. 200780009285.3, mailed May 25, 2010, 18 pp.

* cited by examiner

FIG. 1 reproduced from U.S. Publication No. 2003/0019428 with Applicants' handwritten notations "T" and "W."

METHOD AND APPARATUS FOR REDUCING PARTICLE CONTAMINATION IN A DEPOSITION SYSTEM

CROSS REFERENCE TO RELATED APPLICATIONS

The present invention is related to co-pending U.S. patent application Ser. No. 11/377,237, entitled "METHOD AND APPARATUS FOR REDUCING PARTICLE FORMATION IN A VAPOR DISTRIBUTION SYSTEM", filed on even date herewith, the entire contents of which are herein incorporated by reference.

BACKGROUND OF THE INVENTION

1. Field of Invention

The present invention relates to a method and system for thin film deposition, and more particularly to a method and system for reducing particle contamination of metal layers formed from metal-carbonyl precursors.

2. Description of Related Art

The introduction of copper (Cu) metal into multilayer metallization schemes for manufacturing integrated circuits can necessitate the use of diffusion barriers/liners to promote adhesion and growth of the Cu layers and to prevent diffusion of Cu into the dielectric materials. Barriers/liners that are deposited onto dielectric materials can include refractive materials, such as tungsten (W), molybdenum (Mo), and tantalum (Ta), that are non-reactive and immiscible in Cu, and can offer low electrical resistivity. Current integration schemes that integrate Cu metallization and dielectric materials can require barrier/liner deposition processes at substrate temperature between about 400° C. and about 500° C., or lower.

For example, Cu integration schemes for technology nodes less than or equal to 130 nm can utilize a low dielectric constant (low-k) inter-level dielectric, followed by a physical vapor deposition (PVD) Ta layer or a TaN/Ta layer, followed by a PVD Cu seed layer, and an electrochemical deposition (ECD) Cu fill. Generally, Ta layers are chosen for their adhesion properties (i.e., their ability to adhere on low-k films), and Ta/TaN layers are generally chosen for their barrier properties (i.e., their ability to prevent Cu diffusion into the low-k film).

As described above, significant effort has been devoted to the study and implementation of thin transition metal layers as Cu diffusion barriers, these studies including such materials as chromium, tantalum, molybdenum and tungsten. Each of these materials exhibits low miscibility in Cu. More recently, other materials, such as ruthenium (Ru) and rhodium (Rh), have been identified as potential barrier layers since they are expected to behave similarly to conventional refractory metals. However, the use of Ru, or Rh can permit the use of only one barrier layer, as opposed to two layers, such as Ta/TaN. This observation is due to the adhesive and barrier properties of these materials. For example, one Ru layer can replace the Ta/TaN barrier layer. Moreover, current research is finding that the one Ru layer can further replace the Cu seed layer, and bulk Cu fill can proceed directly following Ru deposition. This observation is due to good adhesion between the Cu and the Ru layers.

Conventionally, Ru layers can be formed by thermally decomposing a ruthenium-containing precursor, such as a ruthenium carbonyl precursor, in a thermal chemical vapor deposition (TCVD) process. Material properties of Ru layers that are deposited by thermal decomposition of ruthenium-carbonyl precursors (e.g., $Ru_3(CO)_{12}$) can deteriorate when the substrate temperature is lowered to below about 400° C. As a result, an increase in the (electrical) resistivity of the Ru layers and poor surface morphology (e.g., the formation of nodules) at low deposition temperatures, has been attributed to increased incorporation of reaction by-products into the thermally deposited Ru layers. Both effects can be explained by a reduced carbon monoxide (CO) desorption rate from the thermal decomposition of the ruthenium-carbonyl precursor at substrate temperatures below about 400° C.

Additionally, the use of metal-carbonyls, such as ruthenium carbonyl or rhenium carbonyl, can lead to poor deposition rates due to their low vapor pressure, and the transport issues associated therewith. Overall, the inventors have observed that current deposition systems suffer from such a low rate, making the deposition of such metal films impractical. Furthermore, the inventors have observed that current deposition systems suffer from poor film uniformity and particle contamination.

SUMMARY OF THE INVENTION

A method and apparatus is provided for reducing particle contamination in a thin film deposition system, and particularly that overcomes one or more of the problems of the prior art.

Further yet, a method and apparatus is provided for reducing particle contamination in metal films formed using metal carbonyl precursors.

In accordance with principles of the present invention, a thin film deposition system is provided with one or more particle diffusers disposed within the deposition system along a flow path of the carrier gas and the metal precursor vapor.

According to one embodiment, a deposition system for forming a refractory metal film on a substrate is described, comprising: a process chamber having a substrate holder configured to support the substrate and heat the substrate, a vapor distribution system configured to introduce metal precursor vapor above the substrate, and a pumping system configured to evacuate the process chamber; a metal precursor evaporation system configured to evaporate a metal precursor to form a metal precursor vapor; a vapor delivery system having a first end coupled to an outlet of the metal precursor evaporation system and a second end coupled to an inlet of the vapor distribution system of the process chamber; a carrier gas supply system coupled to at least one of the metal precursor evaporation system or the vapor delivery system, or both, and configured to supply a carrier gas to transport the metal precursor vapor in the carrier gas through the vapor delivery system to the inlet of the vapor distribution system; and one or more particle diffusers disposed within the deposition system along a flow path of the carrier gas and the metal precursor vapor.

According to another embodiment, a film precursor evaporation system configured to be coupled to a thin film deposition system is described, comprising: a container comprising an outlet configured to be sealably coupled to the thin film deposition system and an inlet configured to be sealably coupled to a carrier gas supply system; a tray stack comprising one or more trays configured to be received within the container, and configured to support and evaporate a metal precursor material in each of the one or more trays to form a metal precursor vapor; and one or more particle diffusers disposed within a flow path of a carrier gas from the carrier gas supply system and the metal precursor vapor between the inlet and the outlet of the container.

According to yet another embodiment, a method of depositing a metal layer on a substrate is described, the method comprising: providing a substrate in a process chamber of a deposition system; forming a process gas containing a metal-carbonyl precursor vapor and a CO gas; introducing the process gas into the process chamber; disposing one or more particle diffusers within the deposition system in order to reduce particle contamination of the substrate; and exposing the substrate to the diluted process gas to deposit a metal layer on the substrate by a vapor deposition process.

DETAILED DESCRIPTION OF PREFERRED EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1:
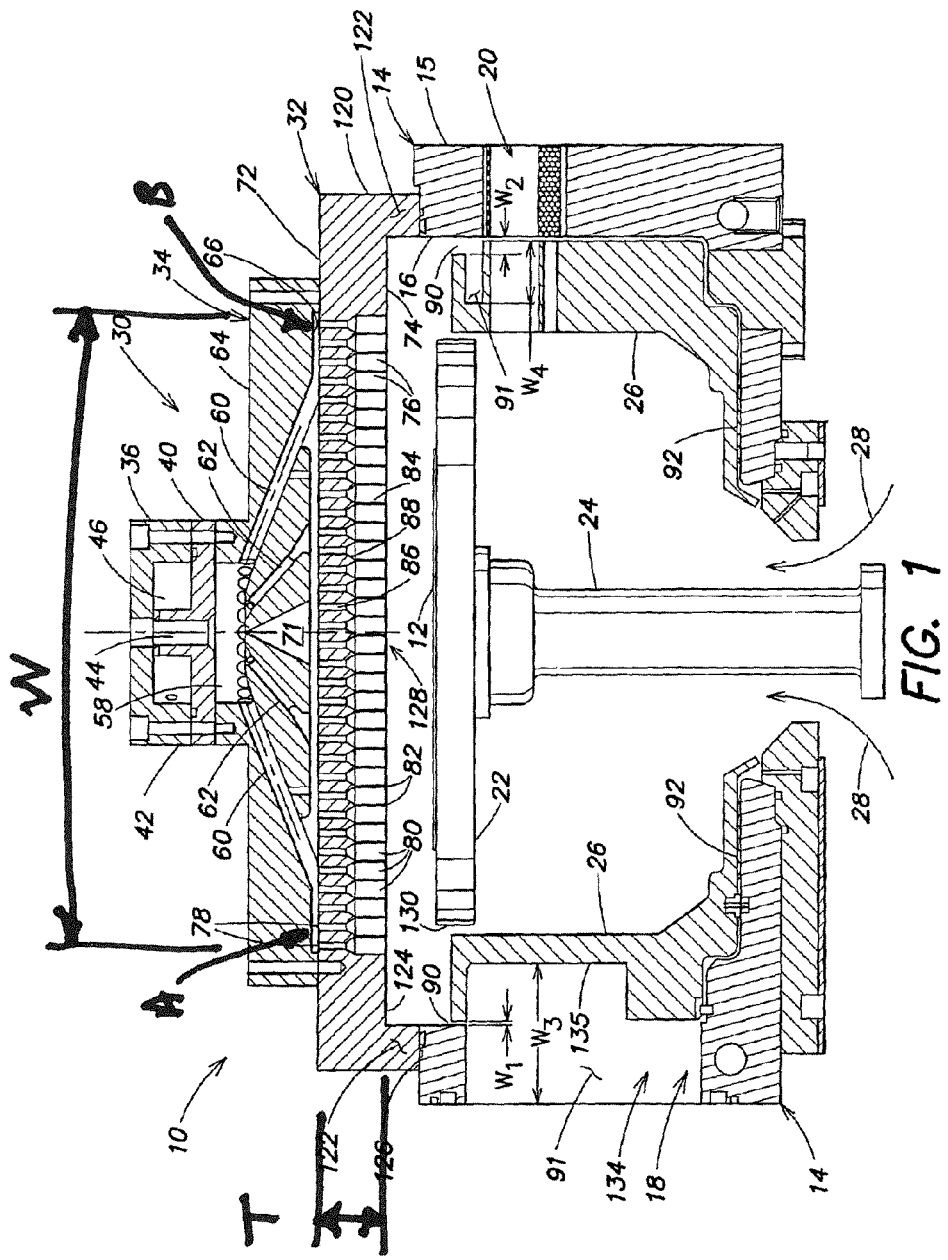
FIG. 1 depicts a schematic view of a deposition system according to an embodiment of the invention.

Referring now to the drawings, wherein like reference numerals designate identical or corresponding parts throughout the several views, FIG. 1 illustrates a deposition system 1 for depositing a metal layer on a substrate from a metal-carbonyl precursor according to one embodiment. The deposition system 1 comprises a process chamber 10 having a substrate holder 20 configured to support a substrate 25, upon which the metal layer is formed. The process chamber 10 is coupled to a metal precursor evaporation system 50 via a vapor precursor delivery system 40.

The process chamber 10 is further coupled to a vacuum pumping system 38 through a duct 36, wherein the pumping system 38 is configured to evacuate the process chamber 10, vapor precursor delivery system 40, and metal precursor evaporation system 50 to a pressure suitable for forming the metal layer on the substrate 25, and suitable for evaporation of the metal-carbonyl precursor 52 in the metal precursor evaporation system 50.

Still referring to FIG. 1, the metal precursor evaporation system 50 is configured to store a metal-carbonyl precursor 52, and heat the metal-carbonyl precursor 52 to a temperature sufficient for evaporating the metal-carbonyl precursor 52 and introducing metal-carbonyl precursor vapor to the vapor precursor delivery system 40. The metal-carbonyl precursor 52 can be solid under the selected heating conditions in the metal precursor evaporation system 50. Alternately, the metal-carbonyl precursor 52 can be a liquid. Below, the use of a solid metal-carbonyl precursor 52 is described; however, those skilled in the art will appreciate that metal-carbonyl precursors that are liquids under the selected heating conditions can be used without departing from the scope of the invention. For instance, the metal-carbonyl precursor can have the general formula $M_x(CO)_y$, and can comprise a tungsten-carbonyl, a molybdenum carbonyl, a cobalt carbonyl, a rhodium carbonyl, a rhenium carbonyl, a chromium carbonyl, or an osmium carbonyl, or a combination of two thereof. These metal-carbonyls include, but are not limited to, $W(CO)_6$, $Ni(CO)_4$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$, or a combination of two or more thereof.

In order to achieve the desired temperature for evaporating the metal-carbonyl precursor 52 (or subliming the solid metal-carbonyl precursor 52), the metal precursor evaporation system 50 is coupled to an evaporation temperature control system 54 configured to control the evaporation temperature. For instance, the temperature of the metal-carbonyl precursor 52 is generally elevated to approximately 40° C. to 45° C. in conventional systems in order to sublime the ruthenium carbonyl $Ru_3(CO)_{12}$. At this temperature, the vapor pressure of the $Ru_3(CO)_{12}$, for instance, ranges from approximately 1 to approximately 3 mTorr. As the metal-carbonyl precursor is heated to cause evaporation (or sublimation), a carrier gas can be passed over or through the metal-carbonyl precursor 52, or any combination thereof. The carrier gas can include, for example, an inert gas, such as a noble gas, He, Ne, Ar, Kr, or Xe, or a combination of two or more thereof. Alternately, other embodiments contemplate omitting a carrier gas.

According to an embodiment of the invention, a CO gas can be added to the carrier gas. Alternately, other embodiments contemplate the CO gas replacing the carrier gas. For example, a gas supply system 60 is coupled to the metal precursor evaporation system 50, and it is configured to, for instance, supply a carrier gas, a CO gas, or a mixture thereof, beneath the metal-carbonyl precursor 52 via feed line 61, or over the metal-carbonyl precursor 52 via feed line 62. In addition, or in the alternative, the gas supply system 60 is coupled to the vapor precursor delivery system 40 downstream from the metal precursor evaporation system 50 to supply the gas to the vapor of the metal-carbonyl precursor 52 via feed line 63 as or after it enters the vapor precursor delivery system 40. Although not shown, the gas supply system 60 can comprise a carrier gas source, a CO gas source, one or more control valves, one or more filters, and a mass flow controller. For instance, the flow rate of the carrier gas can be between about 0.1 standard cubic centimeters per minute (sccm) and about 1000 sccm. Alternately, the flow rate of the carrier gas can be between about 10 sccm and about 500 sccm. Still alternately, the flow rate of the carrier gas can be between about 50 sccm and about 200 sccm. According to embodiments of the invention, the flow rate of the CO gas can range from approximately 0.1 sccm to approximately 1000 sccm. Alternately, the flow rate of the CO gas can be between about 1 sccm and about 100 sccm.

Downstream from the film precursor evaporation system 50, the metal precursor vapor flows with the carrier gas through the vapor delivery system 40 until it enters a vapor distribution system 30 coupled to the process chamber 10. The vapor delivery system 40 can be coupled to a vapor line temperature control system 42 in order to control the vapor line temperature and prevent decomposition of the film precursor vapor as well as condensation of the film precursor vapor. For example, the vapor line temperature can be set to a value approximately equal to or greater than the evaporation temperature. Additionally, for example, the vapor delivery system 40 can be characterized by a high conductance in excess of about 50 liters/second.

Referring again to FIG. 1, the vapor distribution system 30, coupled to the process chamber 10, comprises a plenum 32 within which the vapor disperses prior to passing through a vapor distribution plate 34 and entering a processing zone 33 above substrate 25. In addition, the vapor distribution plate 34 can be coupled to a distribution plate temperature control system 35 configured to control the temperature of the vapor distribution plate 34. For example, the temperature of the vapor distribution plate can be set to a value approximately equal to the vapor line temperature. However, it may be less, or it may be greater.

According to an embodiment of the invention, a dilution gas source 37 can be coupled to the process chamber 10 and can be configured to add a dilution gas to dilute the process gas containing the metal-carbonyl precursor vapor and the CO gas. As shown in FIG. 1, the dilution gas source 37 can be coupled to the vapor distribution system 30 via feed line 37a and configured to add the dilution gas to the process gas in the vapor distribution plenum 32 before the process gas passes through the vapor distribution plate 34 into the processing zone 33. Alternately, the dilution gas source 37 can be coupled to the process chamber 10 via feed line 37b and configured to add the dilution gas to the process gas in the processing zone 33 above the substrate 25 after the process gas passes through the vapor distribution plate 34. Still alternately, the dilution gas source 37 can be coupled to the vapor distribution system 30 via feed line 37c and configured to add the dilution gas to the process gas in the distribution plate 34. As will be appreciated by those skilled in the art, the dilution gas can be added to the process gas at other locations in the vapor distribution system 30 and the process chamber 10.

In yet another embodiment, the dilution gas is introduced to the process gas from the dilution gas source 37 through one of feed lines 37a, 37b, 37c, or other feed lines (not shown) in such a way that the concentration of dilution gas at one region above substrate 25 can be adjusted to be different than the concentration of dilution gas at another region above substrate 25. For example, the flow of dilution gas to a central region of substrate 25 can be different than the flow of dilution gas to a peripheral region of substrate 25.

Once film precursor vapor enters the processing zone 33, the film precursor vapor thermally decomposes upon adsorption at the substrate surface due to the elevated temperature of the substrate 25, and the thin film is formed on the substrate 25. The substrate holder 20 is configured to elevate the temperature of substrate 25 by virtue of the substrate holder 20 being coupled to a substrate temperature control system 22. For example, the substrate temperature control system 22 can be configured to elevate the temperature of substrate 25 up to approximately 500° C. In one embodiment, the substrate temperature can range from about 100° C. to about 500° C. In another embodiment, the substrate temperature can range from about 300° C. to about 400° C. Additionally, process chamber 10 can be coupled to a chamber temperature control system 12 configured to control the temperature of the chamber walls.

As described above, for example, conventional systems have contemplated operating the film precursor evaporation system 50, as well as the vapor delivery system 40, within a temperature range of approximately 40-45° C. for ruthenium carbonyl in order to limit metal vapor precursor decomposition and metal vapor precursor condensation. For example, ruthenium carbonyl precursor can decompose at elevated temperatures to form by-products, such as those illustrated below:

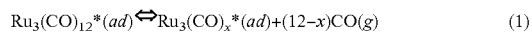

$$Ru_3(CO)_{12}{}^*(ad) \Leftrightarrow Ru_3(CO)_x{}^*(ad) + (12-x)CO(g) \qquad (1)$$

or,

$$Ru_3(CO)_x{}^*(ad) \Leftrightarrow 3Ru(s) + xCO(g) \qquad (2)$$

wherein these by-products can adsorb (ad), i.e., condense, on the interior surfaces of the deposition system 1. The accumulation of material on these surfaces can cause problems from one substrate to the next, such as process repeatability. Alternatively, for example, ruthenium carbonyl precursor can condense at depressed temperatures to cause recrystallization, viz.

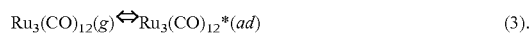

$$Ru_3(CO)_{12}(g) \Leftrightarrow Ru_3(CO)_{12}{}^*(ad) \qquad (3).$$

In summary, low vapor pressure of some metal-carbonyl precursors (e.g., $Ru_3(CO)_{12}$) and the small process window, results in very low deposition rate of a metal layer on the substrate 25.

In connection with related pending U.S. patent application Ser. No. 10/996,145, entitled "METHOD FOR INCREASING DEPOSITION RATES OF METAL LAYERS FROM METAL-CARBONYL PRECURSORS" and filed on Nov. 23, 2004, and pending U.S. patent application Ser. No. 10/996,144, entitled "METHOD AND DEPOSITION SYSTEM FOR INCREASING DEPOSITION RATES OF METAL LAYERS FROM METAL-CARBONYL PRECURSORS" and filed on Nov. 23, 2004, both expressly incorporated by reference herein, it was realized that adding a CO gas to the metal-carbonyl precursor vapor can reduce the above-mentioned problems that limit the delivery of the metal-carbonyl precursor to the substrate. Thus, according to an embodiment, the CO gas is added to the metal-carbonyl precursor vapor to reduce dissociation of the metal-carbonyl precursor vapor in the gas line, thereby shifting the equilibrium in Equation (1) to the left and reducing premature decomposition of the metal-carbonyl precursor in the vapor precursor delivery system 40 prior to delivery of the metal-carbonyl precursor to the process chamber 10. It is believed that addition of the CO gas to the metal-carbonyl precursor vapor allows for increasing the evaporation temperature from approximately 40° C. to approximately 150° C., or higher. The elevated temperature increases the vapor pressure of the metal-carbonyl precursor, resulting in increased delivery of the metal-carbonyl precursor to the process chamber and, hence, increased deposition rate of the metal on the substrate 25. Furthermore, the inventors have visually observed that flowing a mixture of an inert gas, such as Ar, and the CO gas over or through the metal-carbonyl precursor reduces premature decomposition of the metal-carbonyl precursor.

According to another embodiment, the addition of CO gas to a $Ru_3(CO)_{12}$ precursor vapor allows for maintaining the $Ru_3(CO)_{12}$ precursor evaporation temperature from approximately 40° C. to approximately 150° C. Alternately, the evaporation temperature can be maintained at approximately 60° C. to approximately 90° C.

Thermal decomposition of metal-carbonyl precursors and subsequent metal deposition on the substrate 25 is thought to proceed predominantly by CO elimination and desorption of CO by-products from the substrate 25. Incorporation of CO by-products into the metal layers during deposition can result from incomplete decomposition of the metal-carbonyl precursor, incomplete removal of CO by-products from the metal layer, and re-adsorption of CO by-products from the process chamber 10 onto the metal layer.

It is believed that CO incorporation into a metal layer during deposition leads to surface roughness in the form of nodules in the metal layer, where the growth of nodules is enhanced by increased incorporation of CO by-products into the metal layer. The number of nodules is expected to increase as the thickness of the metal layer increases. Furthermore, the incorporation of CO by-products into the metal layer increases the resistivity of the metal layer.

Incorporation of CO by-products into the metal layer can be reduced by (1) lowering the process pressure, and (2) increasing the substrate temperature. The current inventor has realized that the above-mentioned problems can also be reduced by adding a dilution gas in the process chamber 10 to the process gas containing the metal-carbonyl precursor vapor and the CO gas for controlling and reducing the partial pressure of by-products and the CO gas in the process chamber. Thus, according to an embodiment of the invention, a dilution gas from dilution gas source 37 is added to the process gas for controlling and reducing the partial pressure of CO by-products on the metal layer and the partial pressure of CO in the process chamber 10, thereby forming a smooth metal layer. The dilution gas can include, for example, an inert gas, such as a noble gas, He, Ne, Ar, Kr, or Xe, or a mixture of two or more thereof. The dilution gas may further contain a reducing gas to improve the material properties of the metal layer, for example the electrical resistivity. The reducing gas can, for example, contain $H_2$, a silicon-containing gas (e.g., $SiH_4$, $Si_2H_6$, or $SiCl_2H_2$), a boron-containing gas ($BH_3$, $B_2H_6$, or $B_3H_9$), or a nitrogen-containing gas (e.g., $NH_3$). According to an embodiment of the invention, the process chamber pressure can be between about 0.1 mTorr and about 200 mTorr. Alternately, the process chamber pressure can be between about 1 mTorr and about 100 mTorr. Still alternately, the process chamber pressure can be between about 2 mTorr and about 50 mTorr.

Since the addition of the CO gas to the metal-carbonyl precursor vapor increases the thermal stability of the metal-carbonyl precursor vapor, the relative concentration of the metal-carbonyl precursor vapor to the CO gas in the process gas can be utilized to control the decomposition rate of the metal-carbonyl precursor on the substrate 25 at a certain substrate temperature. Furthermore, the substrate temperature can be utilized to control the decomposition rate (and thereby the deposition rate) of the metal on the substrate 25. As those skilled in the art will readily appreciate, the amount of CO gas and the substrate temperature can easily be varied to allow for a desired evaporation temperature of the metal-carbonyl precursor and for achieving a desired deposition rate of the metal-carbonyl precursor on the substrate 25.

Furthermore, the amount of CO gas in the process gas can be selected so that metal deposition on the substrate 25 from a metal-carbonyl precursor occurs in a kinetic-limited temperature regime. For example, the amount of CO gas in the process gas can be increased until the metal deposition process is observed to occur in a kinetic-limited temperature regime. A kinetic-limited temperature regime refers to the range of deposition conditions where the deposition rate of a chemical vapor deposition process is limited by the kinetics of the chemical reactions at the substrate surface, typically characterized by a strong dependence of deposition rate on temperature. Unlike the kinetic-limited temperature regime, a mass-transfer limited regime is normally observed at higher substrate temperatures and includes a range of deposition conditions where the deposition rate is limited by the flux of chemical reactants to the substrate surface. A mass-transfer limited regime is characterized by a strong dependence of deposition rate on metal-carbonyl precursor flow rate and is independent of deposition temperature. Metal deposition in the kinetic-limited regime normally results in good step coverage and good conformality of the metal layer on patterned substrates. Conformality is commonly defined as the thinnest part of the metal layer on the sidewall of a feature on the patterned substrate divided by the thickest part of the metal layer on the sidewall. Step coverage is commonly defined as the sidewall coverage (metal layer thickness on sidewall divided by the metal layer thickness away from the feature) divided by the bottom coverage (metal layer thickness on the bottom of the feature divided by the metal layer thickness away from the feature).

As described above, the introduction of dilution gas to the process gas can be utilized for controlling and reducing the partial pressure of CO by-products on the metal layer and the partial pressure of CO in the process chamber 10 in order to prepare a thin metal film having desirable properties. However, the inventors have observed that the partial pressure of CO by-products, or the partial pressure of CO, or both, can vary across substrate 25, thus leading to non-uniform film properties. For instance, it is suspected that the edge temperature of substrate holder 20 can be greater than the temperature of substrate 25. The higher edge temperature for substrate holder 20 can cause an increase in the production of CO by-products (as suggested above), which can diffuse to the peripheral edge of substrate 25 causing CO poisoning of the thin metal film formed proximate the peripheral edge of substrate 25. Therefore, in one example, as introduced above, the flow of dilution gas to the peripheral edge of substrate 25 can be adjusted relative to the flow of dilution gas to the central region of substrate 25 in order to adjust the relative dilution of CO and CO by-products.

However, even with special care taken to prevent or minimize decomposition of the film precursor vapor as well as condensation and re-crystallization of the film precursor vapor on various surfaces of the deposition system, particle contamination of the thin films formed in the deposition system persist. The inventors suspect that particles originate throughout the deposition system, particularly within the film precursor evaporation system 50, the vapor delivery system 40 and the vapor distribution system 30. Particles may be entrained and transported directly from the storage of solid precursor within the film precursor evaporation system 50, or they may evolve from surfaces within the vapor delivery system 40 or vapor distribution system 30. Therefore, according to one embodiment, one or more particle diffusers are located within the film precursor evaporation system 50, the vapor delivery system 40, or the vapor distribution system 30, or two or more thereof. A particle diffuser can, for example, facilitate the break-up of particle clusters, and possible re-evaporation of the precursor.

For example, referring to FIG. 1, a particle diffuser may be located within the vapor distribution system 30 (see label 47*a*), at an outlet of the vapor delivery system 40 (see label 47*b*), or at an outlet of the film precursor evaporation system 50 (see label 47*c*). Although only three locations are illustrated in FIG. 1, any location throughout the deposition system 1 that lies along the potential flow path between particle evolution and the substrate 25 are contemplated.

In one embodiment, the particle diffuser (47a, 47b, 47c) comprises structure sufficient to minimize the passage of particles of a pre-specified size there-through. In another embodiment, the particle diffuser (47a, 47b, 47c) comprises structure sufficient to break-up particle clusters passing through the diffuser into particle fragments. In yet another embodiment, the particle diffuser (47a, 47b, 47c) is intended to minimize the resistance to the flow of precursor vapor through the diffuser (i.e., maximize the flow conductance through the particle diffuser), while providing additional surface area for intersecting with particle trajectories in order to cause the break-up of particle clusters and re-evaporation of the particle fragments. For example, the particle diffuser (47a, 47b, 47c) may comprise a screen or mesh. Additionally, for example, the particle diffuser (47a, 47b, 47c) may comprise a honeycomb structure. A honeycomb structure can permit a diffuser design that maximizes the total flow-through area, while permitting the selection of each honeycomb cell diameter and length to maximize wetted surface area. Furthermore, for example, the particle diffuser (47a, 47b, 47c) can comprise one or more openings therethrough in order to permit the passage of carrier gas and metal precursor vapor, wherein the one or more openings are substantially aligned with the flow path of the carrier gas and the metal precursor vapor. Alternatively, the particle diffuser (47a, 47b, 47c) can comprise one or more openings therethrough in order to permit the passage of carrier gas and metal precursor vapor, wherein the one or more openings is angled, or curved relative to the flow path of the carrier gas and the metal precursor vapor.

Figure 3:
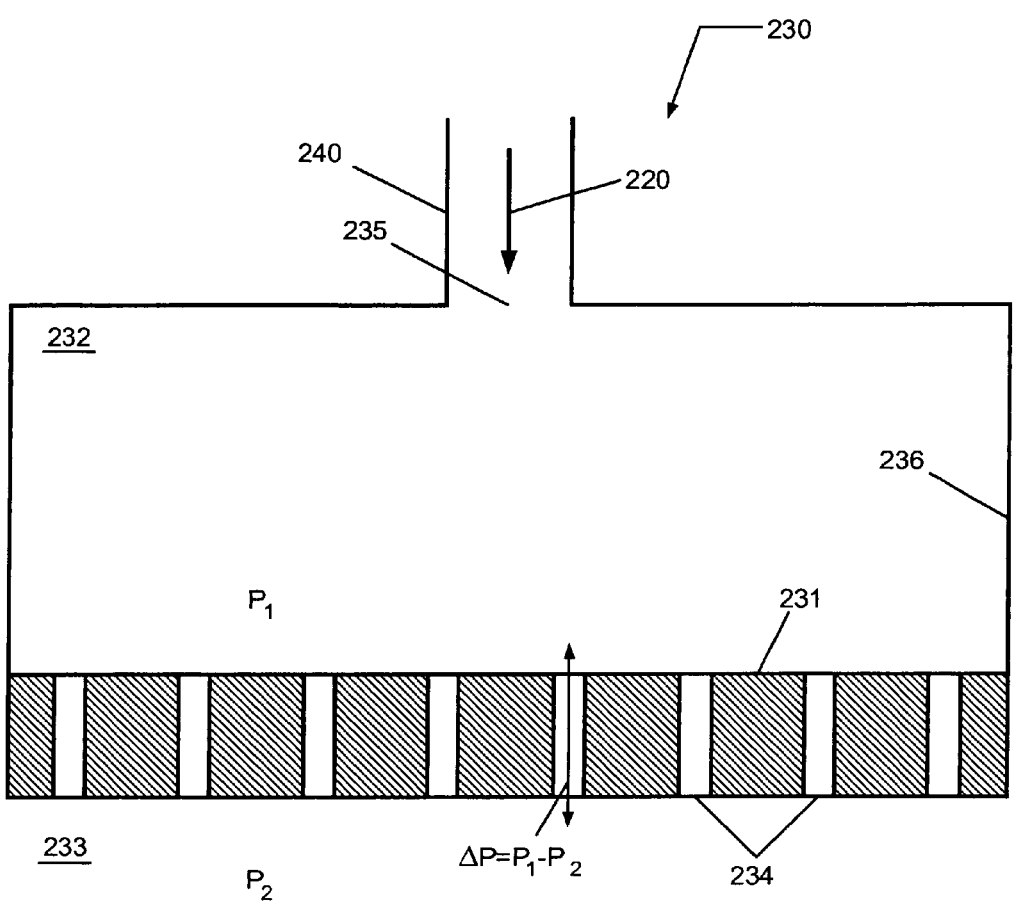
FIG. 3 depicts a vapor distribution system according to one embodiment of the invention.

Furthermore, the inventors suspect that particles may evolve due to sudden changes in gas temperature that cause particle formation through condensation and re-crystallization, and subsequent particle agglomeration while in transport though the deposition system. For example, referring to FIG. 3, an exploded view of an exemplary vapor distribution system is provided. A vapor distribution system 230 is configured to receive a process gas 220, containing the film precursor vapor, in a plenum 232 from vapor delivery system 240 through opening 235, and distribute the process gas 220 within a process space 233 proximate a substrate upon which a thin film, or metal film, is to be formed. The vapor distribution system 240 can include a housing 236, and a vapor distribution plate 231 coupled to the housing 236 to form plenum 232. The vapor distribution plate 231 comprises a plurality of openings 234, through which the process gas passes from the plenum 232 to the process space 233.

For a given flow rate of process gas through the deposition system, a plenum pressure ($P_1$) is established within plenum 232, and a process pressure ($P_2$) is established within process space 233. The difference in pressure $\Delta P$ ($\Delta P = P_1 - P_2$) is related to the flow rate (or throughput) (Q) and the net flow conductance (C) through the plurality of openings 234 in the vapor distribution plate 231, i.e., $\Delta P = Q/C$. Therefore, as the net flow conductance through the plurality of openings is increased, while maintaining the same flow rate (Q), the difference in pressure is decreased.

When the background pressure (e.g., average pressure between the plenum and the process space) is sufficiently high (i.e., the mean free path between atomic/molecular collisions is small compared to the physical scales of the flow, such as the diameter of each opening), then the expansion of the process gas from the plenum 232 to the process space 233 exhibits some continuum fluid behavior through the continuum regime and possibly into the transitional regime, whereby as the gas expands due to the difference in pressure, the gas temperature decreases due to the transfer of thermal energy to kinetic energy (at the macroscopic level). For instance, when a continuum fluid (isentropically) expands through an opening from a total pressure (stagnation pressure), such as the plenum pressure ($P_1$), to a given back pressure, such as the process pressure ($P_2$), the fluid flow becomes choked (volume flow rate ceases to increase upon further decrease of the back pressure) when the pressure ratio ($P_1/P_2$) becomes greater than or equal to $[(\gamma+1)/2]^{\gamma/(\gamma-1)}$, where $\gamma$ represents the ratio of specific heats for the gas (for argon, $\gamma=1.667$, and $P_1/P_2$ (critical)~2.05; and for CO, $\gamma=1.4$, and $P_1/P_2$ (critical)~1.89). Any further reduction in the back pressure (or increase of the pressure ratio) beyond the critical condition causes a free expansion of the gas in the process space.

The cooling of the gas is believed by the inventors to be one proponent for the condensation of the film precursor vapor and formation of particles within process space 233 above the substrate. The extent to which the gas temperature decreases is related to the pressure difference ($\Delta P = P_1 - P_2$), or pressure ratio ($P_1/P_2$). Therefore, according to another embodiment, particle formation and contamination is reduced by designing the vapor distribution plate 231, or changing the process conditions (e.g., Q, $P_1$, $P_2$, etc.), or both, in order to decrease the pressure difference ($\Delta P = P_1 - P_2$), or pressure ratio ($P_1/P_2$).

For example, the vapor distribution plate 231 can be designed with a plurality of openings having a net flow conductance approximately equal to the flow conductance through the vapor delivery system. Alternatively, for example, the vapor distribution plate 231 can be designed with a plurality of openings having a net flow conductance greater than the flow conductance through the vapor delivery system. Alternatively yet, for example, the vapor distribution plate 231 can be designed with a plurality of openings ranging in number from approximately 1 opening to approximately 1000 openings, and desirably ranging in number from approximately 10 openings to approximately 100 openings. Additionally, for example, the vapor distribution plate 231 can be designed with a plurality of openings, each opening having a diameter ranging from approximately 1 mm to approximately 100 mm, and desirably ranging from approximately 4 mm to approximately 10 mm. Furthermore, for example, the vapor distribution plate 231 can be designed with a plurality of openings, each opening having a length ranging from approximately 1 mm to approximately 100 mm, and desirably ranging from approximately 4 mm to approximately 20 mm.

Still referring to FIG. 1, optionally, the deposition system 1 can be periodically cleaned using an in-situ cleaning system 70 coupled to, for example, the vapor delivery system 40, as shown in FIG. 1. Per a frequency determined by the operator, the in-situ cleaning system 70 can perform routine cleanings of the deposition system 1 in order to remove accumulated residue on internal surfaces of deposition system 1. The in-situ cleaning system 70 can, for example, comprise a radical generator configured to introduce chemical radical capable of chemically reacting and removing such residue. Additionally, for example, the in-situ cleaning system 70 can, for example, include an ozone generator configured to introduce a partial pressure of ozone. For instance, the radical generator can include an upstream plasma source configured to generate oxygen or fluorine radical from oxygen ($O_2$), nitrogen trifluoride ($NF_3$), $O_3$, $XeF_2$, $ClF_3$, or $C_3F_8$ (or, more generally, $C_xF_y$), respectively. The radical generator can include an Astron® reactive gas generator, commercially available from MKS Instruments, Inc., ASTeX® Products (90 Industrial Way, Wilmington, Mass. 01887).

Still referring the FIG. 1, the deposition system 1 can further include a control system 80 configured to operate and control the operation of the deposition system 1. The control system 80 is coupled to the process chamber 10, the substrate holder 20, the substrate temperature control system 22, the chamber temperature control system 12, the vapor distribution system 30, the vapor delivery system 40, the film precursor evaporation system 50, the carrier gas supply system 60, the dilution gas source 37, and the optional in-situ cleaning system 70.

Figure 2:
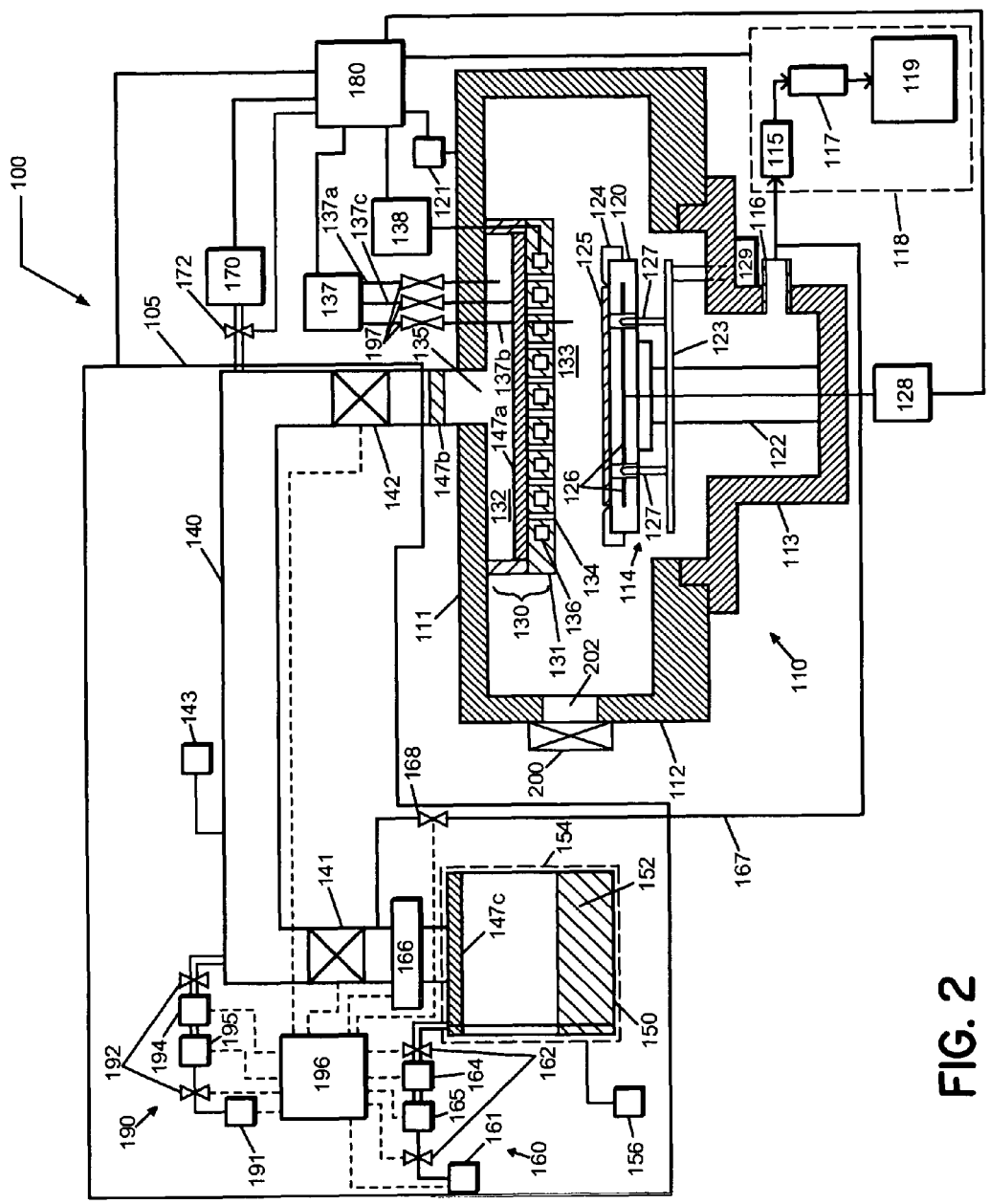
FIG. 2 depicts a schematic view of a deposition system according to another embodiment of the invention.

In another embodiment, FIG. 2 illustrates a deposition system 100 for depositing a metal film, such as a ruthenium (Ru), on a substrate. The deposition system 100 comprises a process chamber having a substrate holder 120 configured to support a substrate 125, upon which the metal layer is formed. The process chamber 110 is coupled to a precursor delivery system 105 having metal precursor evaporation system 150 configured to store and evaporate a metal-carbonyl precursor 152, and a vapor precursor delivery system 140 configured to transport the metal-carbonyl precursor 152 to the process chamber 110.

The process chamber 110 comprises an upper chamber section 111, a lower chamber section 112, and an exhaust chamber 113. An opening 114 is formed within lower chamber section 112, where bottom section 112 couples with exhaust chamber 113.

Referring still to FIG. 2, substrate holder 120 provides a horizontal surface to support substrate (or wafer) 125, which is to be processed. The substrate holder 120 can be supported by a cylindrical support member 122, which extends upward from the lower portion of exhaust chamber 113. An optional guide ring 124 for positioning the substrate 125 on the substrate holder 120 is provided on the edge of substrate holder 120. Furthermore, the substrate holder 120 comprises a heater 126 coupled to substrate holder temperature control system 128. The heater 126 can, for example, include one or more resistive heating elements. Alternately, the heater 126 can, for example, include a radiant heating system, such as a tungsten-halogen lamp. The substrate holder temperature control system 128 can include a power source for providing power to the one or more heating elements, one or more temperature sensors for measuring the substrate temperature or the substrate holder temperature, or both, and a controller configured to perform at least one of monitoring, adjusting, or controlling the temperature of the substrate or substrate holder.

During processing, the heated substrate 125 can thermally decompose the metal-carbonyl precursor vapor, and enable deposition of a metal layer on the substrate 125. According to an embodiment, the metal-carbonyl precursor 152 can be a ruthenium-carbonyl precursor, for example $Ru_3(CO)_{12}$. As will be appreciated by those skilled in the art of thermal chemical vapor deposition, other ruthenium carbonyl precursors can be used without departing from the scope of the invention. The substrate holder 120 is heated to a pre-determined temperature that is suitable for depositing the desired Ru metal layer or other metal layer onto the substrate 125. Additionally, a heater (not shown), coupled to a chamber temperature control system 121, can be embedded in the walls of process chamber 110 to heat the chamber walls to a pre-determined temperature. The heater can maintain the temperature of the walls of process chamber 110 from about 40° C. to about 150° C., or from about 40° C. to about 80° C. A pressure gauge (not shown) is used to measure the process chamber pressure. According to an embodiment of the invention, the process chamber pressure can be between about 0.1 mTorr and about 200 mTorr. Alternately, the process chamber pressure can be between about 1 mTorr and about 100 mTorr. Still alternately, the process chamber pressure can be between about 2 mTorr and about 50 mTorr.

Also shown in FIG. 2, a vapor distribution system 130 is coupled to the upper chamber section 111 of process chamber 110. Vapor distribution system 130 comprises a vapor distribution plate 131 configured to introduce precursor vapor from vapor distribution plenum 132 to a processing zone 133 above substrate 125 through one or more orifices 134.

According to an embodiment of the invention, a dilution gas source 137 is coupled to the process chamber 110 and is configured to add a dilution gas to dilute the process gas containing the metal-carbonyl precursor vapor and the CO gas using feed lines 137a, 137b, and/or 137c, valves 197, one or more filters (not shown), and a mass flow controller (not shown). As shown in FIG. 1, the dilution gas source 137 can be coupled to the vapor distribution system 130 of process chamber 110 and is configured to add the dilution gas to the process gas in the vapor distribution plenum 132 via feed line 137a before the process gas passes through the vapor distribution plate 131 into the processing zone 133 above the substrate 125, or the dilution gas source 137 can be configured to add the dilution gas to the process gas inside the vapor distribution plate 131 via feed line 137c. Alternately, the dilution gas source 137 can be coupled to the process chamber 110 and is configured to add the dilution gas to the process gas in the processing zone 133 via feed line 137b after the process gas passes through the vapor distribution plate 131. As will be appreciated by those skilled in the art, the dilution gas can be added to the process gas at other locations in the process chamber 110 without departing from the scope of the invention.

In yet another embodiment, the dilution gas is introduced to the process gas from the dilution gas source 137 through one of feed lines 137a, 137b, 137c, or other feed lines (not shown) in such a way that the concentration of dilution gas at one region above substrate 125 can be adjusted to be different than the concentration of dilution gas at another region above substrate 125. For example, the flow of dilution gas to a central region of substrate 125 can be different than the flow of dilution gas to a peripheral region of substrate 125.

Furthermore, an opening 135 is provided in the upper chamber section 111 for introducing a metal-carbonyl precursor vapor from vapor precursor delivery system 140 into vapor distribution plenum 132. Moreover, temperature control elements 136, such as concentric fluid channels configured to flow a cooled or heated fluid, are provided for controlling the temperature of the vapor distribution system 130, and thereby prevent the decomposition or condensation of the metal-carbonyl precursor inside the vapor distribution system 130. For instance, a fluid, such as water, can be supplied to the fluid channels from a vapor distribution temperature control system 138. The vapor distribution temperature control system 138 can include a fluid source, a heat exchanger, one or more temperature sensors for measuring the fluid temperature or vapor distribution plate temperature or both, and a controller configured to control the temperature of the vapor distribution plate 131 from about 20° C. to about 150° C.

As illustrated in FIG. 2, a metal precursor evaporation system 150 is configured to hold a metal-carbonyl precursor 152 and evaporate (or sublime) the metal-carbonyl precursor 152 by elevating the temperature of the metal-carbonyl precursor. A precursor heater 154 is provided for heating the metal-carbonyl precursor 152 to maintain the metal-carbonyl precursor 152 at a temperature that produces a desired vapor pressure of metal-carbonyl precursor 152. The precursor heater 154 is coupled to an evaporation temperature control system 156 configured to control the temperature of the metal-carbonyl precursor 152. For example, the precursor heater 154 can be configured to adjust the temperature of the metal-carbonyl precursor 152 from about 40° C. to about 150° C., or from about 60° C. to about 90° C.

As the metal-carbonyl precursor 152 is heated to cause evaporation (or sublimation), a carrier gas can be passed over or through the metal-carbonyl precursor 152, or any combination thereof. The carrier gas can include, for example, an inert gas, such as a noble gas (i.e., He, Ne, Ar, Kr, Xe). Alternately, other embodiments contemplate omitting a carrier gas. According to an embodiment of the invention, a CO gas can be added to the carrier gas. Alternately, other embodiments contemplate the CO gas replacing the carrier gas. For example, a carrier gas supply system 160 is coupled to the metal precursor evaporation system 150, and it is configured to, for instance, flow the carrier gas, the CO gas, or both, over or through the metal-carbonyl precursor 152. Although not shown in FIG. 2, carrier gas supply system 160 can also or alternatively be coupled to the vapor precursor delivery system 140 to supply the carrier gas and/or CO gas to the vapor of the metal precursor 152 as or after it enters the vapor precursor delivery system 140. The carrier gas supply system 160 can comprise a gas source 161 containing a carrier gas, a CO gas, or a mixture thereof, one or more control valves 162, one or more filters 164, and a mass flow controller 165. For instance, the mass flow rate of carrier gas or the CO gas can range from approximately 0.1 sccm to approximately 1000 sccm.

Additionally, a sensor 166 is provided for measuring the total gas flow from the metal precursor evaporation system 150. The sensor 166 can, for example, comprise a mass flow controller, and the amount of metal-carbonyl precursor vapor delivered to the process chamber 110, can be determined using sensor 166 and mass flow controller 165. Alternately, the sensor 166 can comprise a light absorption sensor to measure the concentration of the metal-carbonyl precursor in the gas flow to the process chamber 110.

A bypass line 167 can be located downstream from sensor 166, and it can connect the vapor delivery system 140 to an exhaust line 116. Bypass line 167 is provided for evacuating the vapor precursor delivery system 140, and for stabilizing the supply of the metal-carbonyl precursor to the process chamber 110. In addition, a bypass valve 168, located downstream from the branching of the vapor precursor delivery system 140, is provided on bypass line 167.

Referring still to FIG. 2, the vapor precursor delivery system 140 comprises a high conductance vapor line having first and second valves 141 and 142 respectively. Additionally, the vapor precursor delivery system 140 can further comprise a vapor line temperature control system 143 configured to heat the vapor precursor delivery system 140 via heaters (not shown). The temperatures of the vapor lines can be controlled to avoid condensation of the metal-carbonyl precursor vapor in the vapor line. The temperature of the vapor lines can be controlled from about 20° C. to about 10° C., or from about 40° C. to about 90° C.

Moreover, a CO gas can be supplied from a gas supply system 190. For example, the gas supply system 190 is coupled to the vapor precursor delivery system 140, and it is configured to, for instance, mix the CO gas with the metal-carbonyl precursor vapor in the vapor precursor delivery system, for example, downstream of valve 141. The gas supply system 190 can comprise a CO gas source 191, one or more control valves 192, one or more filters 194, and a mass flow controller 195. For instance, the mass flow rate of CO gas can range from approximately 0.1 sccm (standard cubic centimeters per minute) to approximately 1000 sccm.

Mass flow controllers 165 and 195, and valves 162, 192, 168, 141, and 142 are controlled by controller 196, which controls the supply, shutoff, and the flow of the carrier gas, the CO gas, and the metal-carbonyl precursor vapor. Sensor 166 is also connected to controller 195 and, based on output of the sensor 166, controller 195 can control the carrier gas flow through mass flow controller 165 to obtain the desired metal-carbonyl precursor flow to the process chamber 110.

According to another embodiment, one or more particle diffusers are located within the film precursor evaporation system 150, the vapor delivery system 140, or the vapor distribution system 130, or two or more thereof. For example, referring to FIG. 2, a particle diffuser may be located within the vapor distribution system 130 (see label 147a), at an outlet of the vapor delivery system 140 (see label 147b), or at an outlet of the film precursor evaporation system 150 (see label 147c). Although only three locations are illustrated in FIG. 2, any location throughout the deposition system 101 that lies along the potential flow path between particle evolution and the substrate 125 are contemplated.

In one embodiment, the particle diffuser (147a, 147b, 147c) comprises structure sufficient to minimize the passage of particles of a pre-specified size there-through. In another embodiment, the particle diffuser (147a, 147b, 147c) comprises structure sufficient to break-up particles passing through the diffuser into particle fragments. In yet another embodiment, the particle diffuser (147a, 147b, 147c) is intended to minimize the resistance to the flow of precursor vapor through the diffuser (i.e., maximize the flow conductance through the particle diffuser), while providing additional surface area for intersecting with particle trajectories in order to cause the break-up of particles and re-evaporation of the particle fragments. For example, the particle diffuser (147a, 147b, 147c) may comprise a screen or mesh. Additionally, for example, the particle diffuser (147a, 147b, 147c) may comprise a honeycomb structure. A honeycomb structure can permit a diffuser design that maximizes the total flow-through area, while permitting the selection of each honeycomb cell diameter and length to maximize wetted surface area.

Furthermore, as described above, and as shown in FIG. 2, an optional in-situ cleaning system 170 is coupled to the precursor delivery system 105 of deposition system 100 through cleaning valve 172. For instance, the in-situ cleaning system 170 can be coupled to the vapor delivery system 140. The in-situ cleaning system 170 can, for example, comprise a radical generator configured to introduce chemical radical capable of chemically reacting and removing such residue. Additionally, for example, the in-situ cleaning system 170 can, for example, include an ozone generator configured to introduce a partial pressure of ozone. For instance, the radical generator can include an upstream plasma source configured to generate oxygen or fluorine radical from oxygen ($O_2$), nitrogen trifluoride ($NF_3$), $ClF_3$, $O_3$, $XeF_2$, or $C_3F_8$ (or, more generally, $C_xF_y$), respectively. The radical generator can include an Astron® reactive gas generator, commercially available from MKS Instruments, Inc., ASTeX® Products (90 Industrial Way, Wilmington, Mass. 01887).

As illustrated in FIG. 2, the exhaust line 116 connects exhaust chamber 113 to pumping system 118. A vacuum pump 119 is used to evacuate process chamber 110 to the desired degree of vacuum, and to remove gaseous species from the process chamber 110 during processing. An automatic pressure controller (APC) 115, and a trap 117 can be used in series with the vacuum pump 119. The vacuum pump 119 can include a turbo-molecular pump (TMP) capable of a pumping speed up to 500 liters per second (and greater). Alternately, the vacuum pump 119 can include a dry roughing pump. During processing, the process gas can be introduced into the process chamber 110, and the chamber pressure can be adjusted by the APC 115. The APC 115 can comprise a butterfly-type valve, or a gate valve. The trap 117 can collect unreacted metal-carbonyl precursor material, and by-products from the process chamber 110.

Referring back to the substrate holder 120 in the process chamber 110, as shown in FIG. 2, three substrate lift pins 127 (only two are shown) are provided for holding, raising, and lowering the substrate 125. The substrate lift pins 127 are coupled to plate 123, and can be lowered to below to the upper surface of substrate holder 120. A drive mechanism 129 utilizing, for example, an air cylinder provides means for raising and lowering the plate 123. Substrate 125 can be transferred into and out of process chamber 110 through gate valve 200 and chamber feed-through passage 202 via a robotic transfer system (not shown), and received by the substrate lift pins 127. Once the substrate 125 is received from the transfer system, it can be lowered to the upper surface of the substrate holder 120 by lowering the substrate lift pins 127.

Referring again to FIG. 2, a controller 180 includes a microprocessor, a memory, and a digital I/O port capable of generating control voltages sufficient to communicate and activate inputs of the processing system 100 as well as monitor outputs from the processing system 100. Moreover, the processing system controller 180 is coupled to and exchanges information with process chamber 110; precursor delivery system 105, which includes controller 196, vapor line temperature control system 143, metal precursor evaporation system 150, gas supply system 190, carrier gas supply system 160, and evaporation temperature control system 156; vapor distribution temperature control system 138; dilution gas source 137; vacuum pumping system 118; and substrate holder temperature control system 128. In the vacuum pumping system 118, the controller 180 is coupled to and exchanges information with the automatic pressure controller 115 for controlling the pressure in the process chamber 110. A program stored in the memory is utilized to control the aforementioned components of deposition system 100 according to a stored process recipe. One example of processing system controller 180 is a DELL PRECISION WORKSTATION 610™, available from Dell Corporation, Dallas, Tex. The controller 180 may also be implemented as a general-purpose computer, digital signal process, etc.

Controller 180 may be locally located relative to the deposition system 100, or it may be remotely located relative to the deposition system 100 via an internet or intranet. Thus, controller 180 can exchange data with the deposition system 100 using at least one of a direct connection, an intranet, or the internet. Controller 180 may be coupled to an intranet at a customer site (i.e., a device maker, etc.), or coupled to an intranet at a vendor site (i.e., an equipment manufacturer). Furthermore, another computer (i.e., controller, server, etc.) can access controller 180 to exchange data via at least one of a direct connection, an intranet, or the internet.

Figure 4:
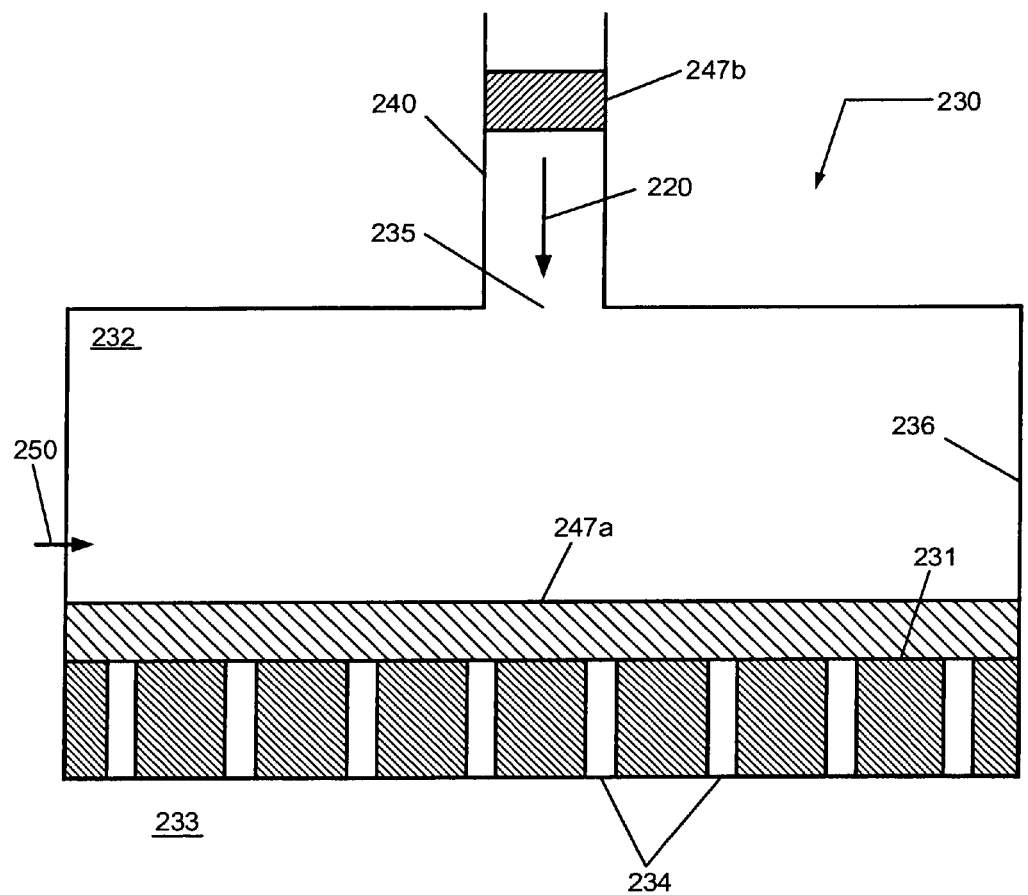
FIG. 4 depicts a vapor distribution system according to another embodiment of the invention.

Referring now to FIG. 4, the vapor distribution system 230 is illustrated in accordance with one embodiment of the present invention. The vapor distribution system 230 is configured to receive process gas 220 in plenum 232 from vapor delivery system 240 through opening 235, and distribute the process gas 220 within process space 233 proximate a substrate upon which a metal film is to be formed. Additionally, the vapor distribution system is optionally configured to receive a dilution gas 250 from a dilution gas source (not shown) in plenum 232, hence, permitting the process gas 220 and the dilution gas 250 to mix, and then distribute the dilution gas 250 with the process gas 220 in process space 233. Furthermore, the plenum 232 is optionally partitioned using an optional partition (not shown) such that only select regions (e.g., only a peripheral region or only a central region) of plenum 232 receive dilution gas 250. Alternatively, the dilution gas 250 is optionally introduced directly to process space 233, while process gas 220 is introduced to the process space 233 from plenum 232.

The vapor distribution system 230 comprises a housing 236 configured to be coupled to a deposition system and a vapor distribution plate 231 configured to be coupled to the housing 236, wherein the combination form a plenum 232. The vapor distribution plate 231 comprises a plurality of openings 234 arranged to introduce the process gas 220 in plenum 232 to process space 233. The optional dilution gas 250 can, for example, include an inert gas, such as Ar, or any one of the dilution gases presented above. Furthermore, the vapor distribution system 230 comprises a particle diffuser located, for example, proximate the vapor distribution plate 231 (see label 247a) or proximate opening 235 (see label 247b).

Figure 5:
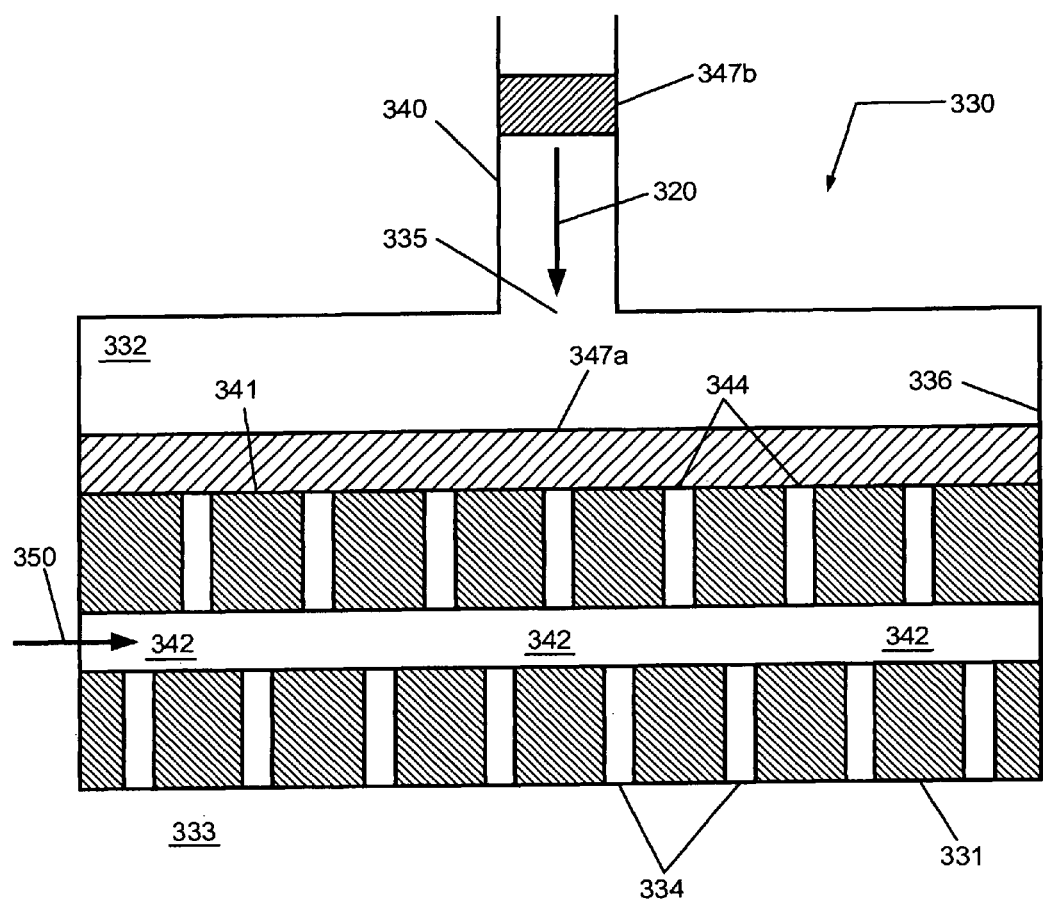
FIG. 5 depicts a vapor distribution system according to another embodiment of the invention.

Referring now to FIG. 5, a vapor distribution system 330 is illustrated in accordance with another embodiment of the present invention. The vapor distribution system 330 is configured to receive a process gas 320 in a plenum 332 from vapor delivery system 340 through opening 335, and distribute the process gas 320 within a process space 333 proximate a substrate upon which a metal film is to be formed. Additionally, the vapor distribution system is optionally configured to receive a dilution gas 350 from a dilution gas source (not shown) in an intermediate plenum 342, hence, permitting the process gas 320 and the dilution gas 350 to mix in the intermediate plenum 342, and then distribute the dilution gas 350 with the process gas 320 in process space 333. Furthermore, the intermediate plenum 342 is optionally partitioned using an optional partition (not shown) such that only select regions (e.g., only a peripheral region or only a central region) of intermediate plenum 342 receive dilution gas 350.

The vapor distribution system 330 comprises a housing 336 configured to be coupled to a deposition system, an intermediate plate 341 configured to be coupled to housing 336, a vapor distribution plate 331 configured to be coupled to housing 336, wherein the combination form plenum 332 and intermediate plenum 342 as shown in FIG. 5. The vapor distribution plate 331 comprises a plurality of openings 334 arranged to introduce the process gas 320 and the optional dilution gas 350 in intermediate plenum 332 to process space 333. Additionally, the intermediate vapor distribution plate 341 comprises a plurality of openings 344 arranged to introduce the process gas 320 in plenum 332 to the intermediate plenum 342. The plurality of openings 344 in intermediate vapor distribution plate 341 may be aligned with the plurality of openings 334 in vapor distribution plate 331. The plurality of openings 344 in intermediate vapor distribution plate 341 may not be aligned with the plurality of openings 334 in vapor distribution plate 331. The optional dilution gas 350 can, for example, include an inert gas, such as Ar, or any one of the dilution gases presented above. Furthermore, the vapor distribution system 330 comprises a particle diffuser located, for example, proximate the intermediate vapor distribution plate 341 (see label 347a) or proximate opening 335 (see label 347b). Additionally, a particle diffuser (not shown) can be located within the intermediate plenum 342 between the intermediate vapor distribution plate 341 and the vapor distribution plate 331.

Figure 6:
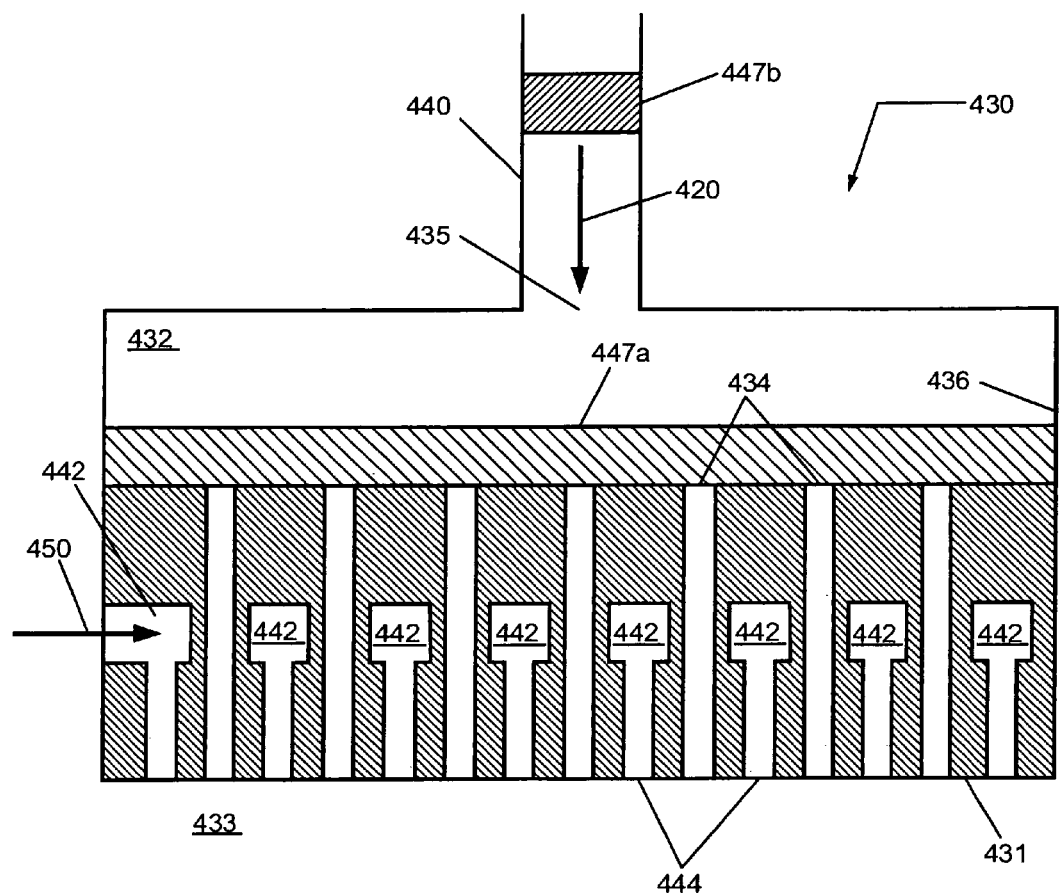
FIG. 6 depicts a vapor distribution system according to another embodiment of the invention.

Referring now to FIG. 6, a vapor distribution system 430 is illustrated in accordance with another embodiment of the present invention. The vapor distribution system 430 is configured to receive a process gas 420 in a plenum 432 from vapor delivery system 440 through opening 435, and distribute the process gas 420 within a process space 433 proximate a substrate upon which a metal film is to be formed. Furthermore, the vapor distribution system is configured to receive a dilution gas 450 from a dilution gas source (not shown), and distribute the dilution gas 450 in process space 433.

The vapor distribution system 430 comprises a housing 436 configured to be coupled to a deposition system and a multi-gas vapor distribution plate 431 configured to be coupled to the housing 436, wherein the combination form a plenum 432. The multi-gas vapor distribution plate 431 comprises a first set of openings 434 arranged to introduce the process gas 420 in plenum 432 to process space 433. Additionally, the multi-gas vapor distribution plate 431 comprises a second set of openings 444 coupled to an intermediate plenum 442 embedded within the multi-gas vapor distribution plate 431 and configured to introduce dilution gas 450 from the intermediate plenum 442 to process space 433. The dilution gas 450 can, for example, include an inert gas, such as Ar, or any one of the dilution gases presented above. Furthermore, the vapor distribution system 430 comprises a particle diffuser located, for example, proximate the multi-gas vapor distribution plate 431 (see label 447a) or proximate opening 435 (see label 447b).

Figure 7:
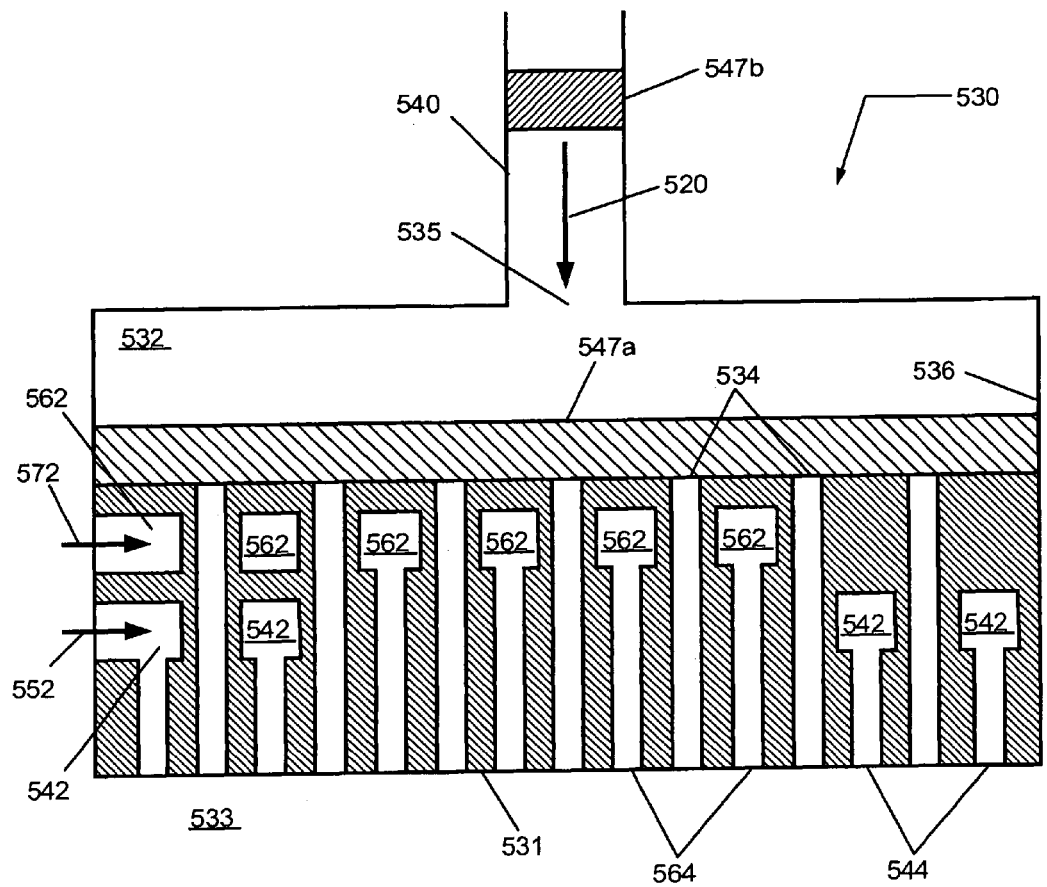
FIG. 7 depicts a vapor distribution system according to another embodiment of the invention.

Referring now to FIG. 7, a vapor distribution system 530 is illustrated in accordance with another embodiment of the present invention. The vapor distribution system 530 is configured to receive a process gas 520 in a plenum 532 from vapor delivery system 540 through opening 535, and distribute the process gas 520 within a process space 533 proximate a substrate upon which a metal film is to be formed. Additionally, the vapor distribution system is configured to receive a dilution gas 550 from a dilution gas source (not shown), and distribute the dilution gas 550 proximate a first region, such as a region substantially above a peripheral region of the substrate, in process space 533. Furthermore, the vapor distribution system is configured to receive a second dilution gas 570 from a dilution gas source (not shown), and distribute the second dilution gas 570 proximate a second region, such as a region substantially above a center region of the substrate, in process space 533.

The vapor distribution system 530 comprises a housing 536 configured to be coupled to a deposition system and a multi-gas vapor distribution plate 531 configured to be coupled to the housing 536, wherein the combination form a plenum 532. The multi-gas vapor distribution plate 531 comprises a first set of openings 534 arranged to introduce the process gas 520 in plenum 532 to process space 533. Additionally, the multi-gas vapor distribution plate 531 comprises a second set of openings 544 coupled to an intermediate plenum 542 embedded with the multi-gas vapor distribution plate 531 and configured to introduce the dilution gas 550 from the intermediate plenum 542 to the first region in process space 533. Furthermore, the multi-gas vapor distribution plate 531 comprises a third set of openings 564 coupled to a second intermediate plenum 562 embedded within the multi-gas vapor distribution plate 531 and configured to introduce the second dilution gas 570 from the intermediate plenum 562 to the second region in process space 533. The flow rate of dilution gas 550 and the flow rate of the second dilution gas 570 may be varied relative to one another in order to affect changes in the uniformity of the metal film deposited on the substrate. The dilution gas 550 and second dilution gas 570 can, for example, include an inert gas, such as Ar, or any one of the dilution gases presented above. Furthermore, the vapor distribution system 530 comprises a particle diffuser located, for example, proximate the multi-gas vapor distribution plate 531 (see label 547a) or proximate opening 535 (see label 547b).

Figure 8:
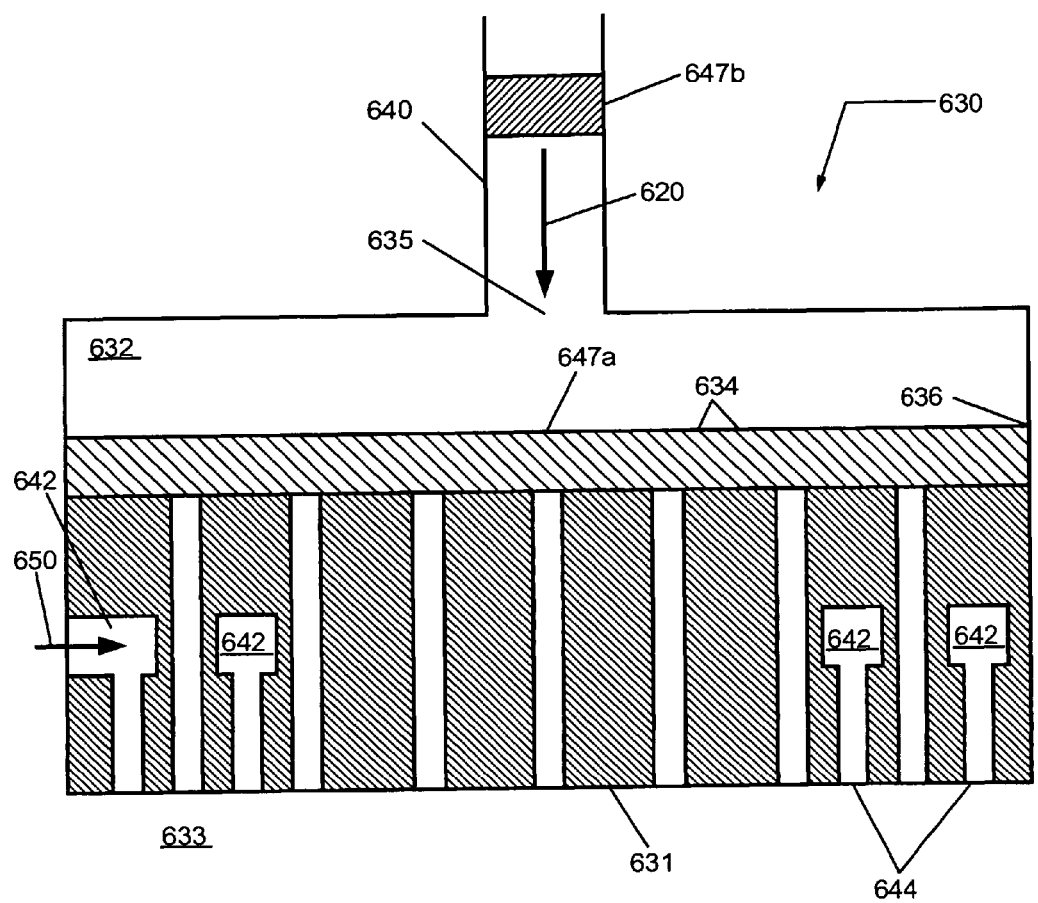
FIG. 8 depicts a vapor distribution system according to another embodiment of the invention.

Referring now to FIG. 8, a vapor distribution system 630 is illustrated in accordance with another embodiment of the present invention. The vapor distribution system 630 is configured to receive a process gas 620 in a plenum 632 from vapor delivery system 640 through opening 635, and distribute the process gas 620 within a process space 633 proximate a substrate upon which a metal film is to be formed. Additionally, the vapor distribution system is configured to receive a dilution gas 650 from a dilution gas source (not shown), and distribute the dilution gas 650 proximate a peripheral region, such as a region substantially above a peripheral region of the substrate, in process space 633.

The vapor distribution system 630 comprises a housing 636 configured to be coupled to a deposition system and a multi-gas vapor distribution plate 631 configured to be coupled to the housing 636, wherein the combination form a plenum 632. The multi-gas vapor distribution plate 631 comprises a first set of openings 634 arranged to introduce the process gas 620 in plenum 632 to process space 633. Additionally, the multi-gas vapor distribution plate 631 comprises a second set of openings 644 coupled to an intermediate plenum 642 embedded within the multi-gas vapor distribution plate 631 and configured to introduce the dilution gas 650 from the intermediate plenum 642 to the peripheral region in process space 633. The dilution gas 650 can, for example, include an inert gas, such as Ar, or any one of the dilution gases presented above. Furthermore, the vapor distribution system 630 comprises a particle diffuser located, for example, proximate the multi-gas vapor distribution plate 631 (see label 647a) or proximate opening 635 (see label 647b).

Figure 9:
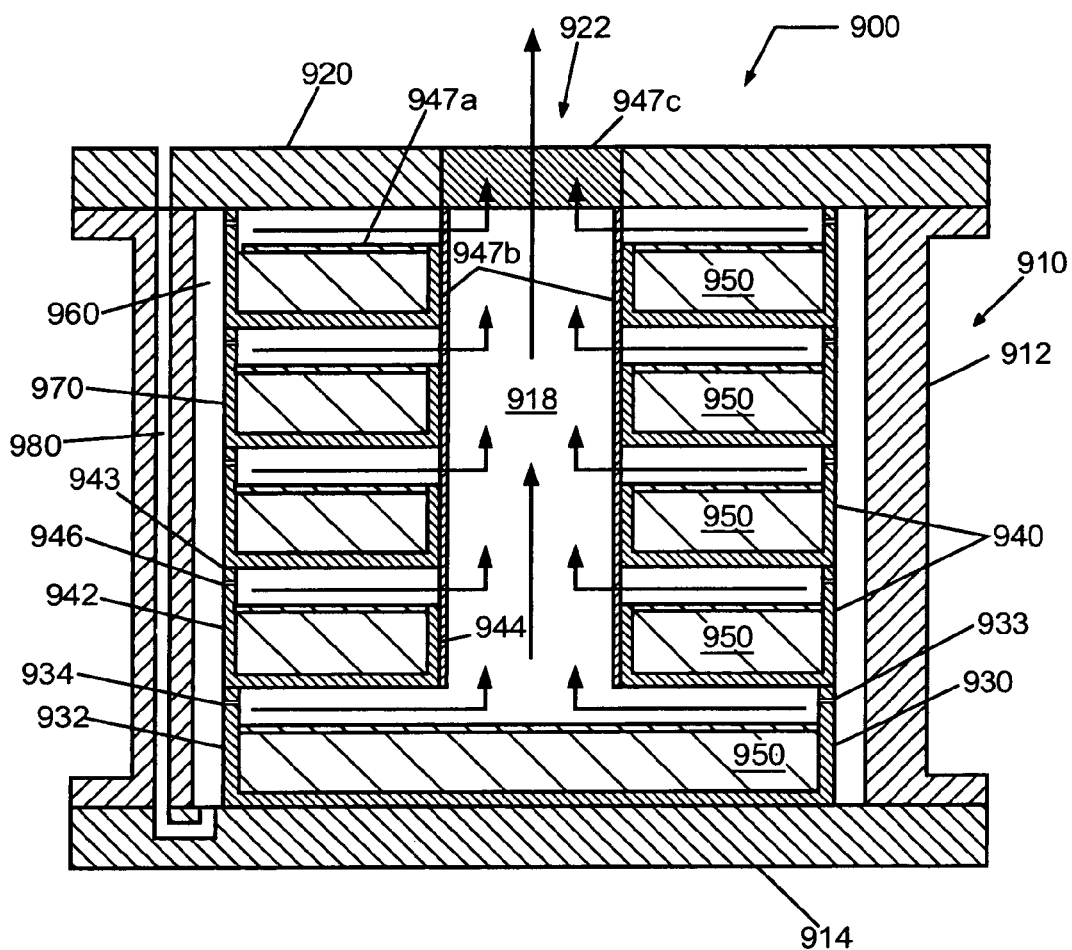
FIG. 9 depicts a film precursor evaporation system according to one embodiment of the invention.

Referring now to FIG. 9, a film precursor evaporation system 900 is depicted in cross-sectional view according to an embodiment. The film precursor evaporation system 900 comprises a container 910 having an outer wall 912 and a bottom 914. Additionally, the film precursor evaporation system 900 comprises a lid 920 configured to be sealably coupled to the container 910, wherein the lid 920 includes an outlet 922 configured to be sealably coupled to a thin film deposition system, such as the one depicted in FIG. 1 or 2. The container 910 and lid 920 form a sealed environment when coupled to the thin film deposition system.

Furthermore, the container 910 is configured to be coupled to a heater (not shown) in order to elevate the evaporation temperature of the film precursor evaporation system 900, and to a temperature control system (not shown) in order to perform at least one of monitoring, adjusting, or controlling the evaporation temperature. When the evaporation temperature is elevated to an appropriate value as described earlier, film precursor evaporates (or sublimes) forming film precursor vapor to be transported through the vapor delivery system to the thin film deposition system. The container 910 is also sealably coupled to a carrier gas supply system (not shown), wherein container 910 is configured to receive a carrier gas for transporting the film precursor vapor.

Referring still to FIG. 9, the film precursor evaporation system 900 further comprises a base tray 930 configured to rest on the bottom 914 of the container 910, and having a base outer wall 932 configured to retain the film precursor 950 on the base tray 930. The base outer wall 932 includes a base support edge for supporting upper trays thereon, as discussed below. Furthermore, the base outer wall 932 includes one or more base tray openings 934 configured to flow the carrier gas from the carrier gas supply system (not shown), over the film precursor 950 towards a center of the container 910, and along an evaporation exhaust space, such as a central flow channel 918, to exhaust through the outlet 922 in the lid 920 with film precursor vapor. Consequently, the film precursor level in the base tray 930 should be below the position of the base tray openings 934.

Referring still to FIG. 9, the film precursor evaporation system 900 further comprises one or more stackable upper trays 940 configured to support the film precursor 950, and configured to be positioned or stacked upon at least one of the base tray 930 or another of the stackable upper trays 940. Each of the stackable upper trays 940 comprises an upper outer wall 942 and an inner wall 944 configured to retain the film precursor 950 therebetween. The inner walls 944 define the central flow channel 918. The upper outer wall 942 further includes an upper support edge 993 for supporting an additional upper tray 940. Thus, a first upper tray 940 is positioned to be supported on base support edge 933 of base tray 930, and if desired, one or more additional upper trays may be positioned to be supported on the upper support edge 943 of a preceding upper tray 940. The upper outer wall 942 of each upper tray 940 includes one or more upper tray openings 946 configured to flow the carrier gas from the carrier gas supply system (not shown), over the film precursor 950 towards central flow channel 918 of the container 910, and exhaust through the outlet 922 in the lid 920 with film precursor vapor. Consequently, inner walls 944 should be shorter than upper outer walls 942 to allow the carrier gas to flow substantially radially to the central flow channel 918. Additionally, the film precursor level in each upper tray 940 should be at or below the height of the inner walls 942, and below the position of the upper tray openings 946.

The base tray 930 and the stackable upper trays 940 are depicted to be cylindrical in shape. However, the shape can vary. For instance, the shape of the trays can be rectangular, square or oval. Similarly, the inner walls 944, and thus central upper flow channel 918, can be differently shaped.

When one or more stackable upper trays 940 are stacked upon the base tray 930, a stack 970 is formed, which provides for a carrier gas supply space, such as an annular space 960, between the base outer wall 932 of the base tray 930 and the container outer wall 912, and between the upper outer walls 942 of the one or more stackable upper trays 940 and the container outer wall 912. The container 910 can further comprise one or more spacers (not shown) configured to space the base outer wall 932 of the base tray 930 and the upper outer walls 942 of the one or more stackable upper trays 940 from the container outer wall 912, and thereby ensure equal spacing within the annular space 960. To state it another way, in one embodiment, the container 910 is configured such that the base outer wall 932 and the upper outer walls 942 are in vertical alignment. Additionally, the container 910 can comprise one or more thermal contact members (not shown) configured to provide mechanical contact between the inner wall of container 910 and the outer wall of each tray, thereby assisting the conduction of thermal energy from the wall of container 910 to each respective tray.

A sealing device, such as an O-ring, may be located between each tray and the adjacent tray or trays in order to provide a vacuum seal between one tray and the next. For example, the sealing device can be retained in a receiving groove (not shown) formed in the upper support edge 943 of upper outer wall(s) 942 and the base support edge 933 of base outer wall 932. Therefore, once the trays are installed in container 910, the coupling of lid 920 to container 910 can facilitate compression of each sealing device. The sealing device can, for example, include an elastomer O-ring. Additionally, the sealing device can, for example, include a Viton® O-ring.

The number of trays, including both the base tray and the stackable upper trays, can range from two (2) to twenty (20) and, for example in one embodiment, the number of trays can be five (5), as shown in FIG. 9. In an exemplary embodiment, the stack 970 includes a base tray 930 and at least one upper tray 940 supported by the base tray 930. The base tray 930 may be as shown in FIG. 9, or may have the same configuration as the upper trays 940 as they are shown in FIG. 9. In other words, the base tray 930 may have an inner wall. Although, in FIG. 9, the stack 970 is shown to comprise a base tray 930 with one or more separatable and stackable upper trays 940, a system may include a container with a stack that comprises a single unitary piece having a base tray integral with one or more upper trays, such that the base outer wall and upper outer walls are integral. Integral is understood to include a monolithic structure, such as an integrally molded structure having no discernible boundaries between trays, as well as a permanently adhesively or mechanically joined structure where there is permanent joinder between the trays. Separatable is understood to include no joinder between trays or temporary joinder, whether adhesive or mechanical.

The base tray 930 and each of the upper trays 940, whether stackable or integral, are configured to support a film precursor 950. According to one embodiment, the film precursor 950 includes a solid precursor. According to another embodiment, the film precursor 950 includes a liquid precursor. According to another embodiment, the film precursor 950 includes a metal precursor. According to another embodiment, the film precursor 950 includes a solid metal precursor. According to yet another embodiment, the film precursor 950 includes a metal-carbonyl precursor. According to yet another embodiment, the film precursor 950 can be a ruthenium-carbonyl precursor, for example $Ru_3(CO)_{12}$. According to yet another embodiment of the invention, the film precursor 950 can be a rhenium carbonyl precursor, for example $Re_2(CO)_{10}$. In yet another embodiment, the film precursor 950 can be $W(CO)_6$, $Mo(CO)_6$, $Co_2(CO)_8$, $Rh_4(CO)_{12}$, $Cr(CO)_6$, or $Os_3(CO)_{12}$. Additionally, according to yet another embodiment, when depositing tantalum (Ta), the film precursor 950 can include $TaF_5$, $TaCl_5$, $TaBr_5$, $TaI_5$, $Ta(CO)_5$, $Ta[N(C_2H_5CH_3)]_5$ (PEMAT), $Ta[N(CH_3)_2]_5$ (PDMAT), $Ta[N(C_2H_5)_2]_5$ (PDEAT), $Ta(NC(CH_3)_3)(N(C_2H_5)_2)_3$ (TBTDET), $Ta(NC_2H_5)(N(C_2H_5)_2)_3$, $Ta(NC(CH_3)_2C_2H_5)(N(CH_3)_2)_3$, $Ta(NC(CH_3)_3)(N(CH_3)_2)_3$, or $Ta(EtCp)_2(CO)H$. Additionally, according to yet another embodiment, when depositing titanium (Ti), the film precursor 950 can include $TiF_4$, $TiCl_4$, $TiBr_4$, $TiI_4$, $Ti[N(C_2H_5CH_3)]_4$ (TEMAT), $Ti[N(CH_3)_2]_4$ (TDMAT), or $Ti[N(C_2H_5)_2]_4$ (TDEAT). Additionally, according to yet another embodiment, when depositing ruthenium (Ru), the film precursor 950 can include $Ru(C_5H_5)_2$, $Ru(C_2H_5C_5H_4)_2$, $Ru(C_3H_7C_5H_4)_2$, $Ru(CH_3C_5H_4)_2$, $Ru_3(CO)_{12}$, $C_5H_4Ru(CO)_3$, $RuCl_3$, $Ru(C_{11}H_{19}O_2)_3$, $Ru(C_8H_{13}O_2)_3$, or $Ru(C_5H_7O)_3$.

As described above, the film precursor 950 can include a solid precursor. The solid precursor can take the form of a solid powder, or it may take the form of one or more solid tablets. For example, the one or more solid tablets can be prepared by a number of processes, including a sintering process, a stamping process, a dipping process, or a spin-on process, or any combination thereof. Additionally, the solid precursor in solid tablet form may or may not adhere to the base tray 930 or upper tray 940. For example, a refractory metal powder may be sintered in a sintering furnace configured for both vacuum and inert gas atmospheres, and temperature up to 2000° C. and 2500° C. Alternatively, for example, a refractory metal powder can be dispersed in a fluid medium, dispensed on a tray, and distributed evenly over the tray surfaces using a spin coating process. The refractory metal spin coat may then be thermally cured.

As described earlier, carrier gas is supplied to the container 910 from a carrier gas supply system (not shown). As shown in FIG. 9, the carrier gas may be coupled to the container 910 through the lid 920 via a gas supply line (not shown) sealably coupled to the lid 920. The gas supply line feeds a gas channel 980 that extends downward through the outer wall 912 of container 910, passes through the bottom 914 of container 910 and opens to the annular space 960.

Alternatively, the carrier gas may be coupled to the container 910 of film precursor evaporation system 900 through an opening (not shown) in lid 920, and directly supply gas to annular space 960. Alternatively, the carrier gas may be coupled to the container 910 of film precursor evaporation system 900 through an opening (not shown) in outer wall 912, and directly supply gas to annular space 960.

Referring still to FIG. 9, the film precursor evaporation system 950 comprises one or more particle diffusers (947a, 947b, 947c). For example, a particle diffuser may be located proximate the film precursor 950 (see label 947a), proximate the inner walls 944 of each tray 940 (see label 947b), or proximate the outlet 922 of the film precursor evaporation system 900 (see label 947c). Although only three locations are illustrated in FIG. 9, any location throughout the film precursor evaporation system 900 that lies along the potential flow path between particle evolution and the outlet 922 are contemplated.

In one embodiment, the particle diffuser (947a, 947b, 947c) comprises structure sufficient to minimize the passage of particles of a pre-specified size there-through. In another embodiment, the particle diffuser (947a, 947b, 947c) comprises structure sufficient to break-up particles passing through the diffuser into particle fragments. In yet another embodiment, the particle diffuser (947a, 947b, 947c) is intended to minimize the resistance to the flow of precursor vapor through the diffuser (i.e., maximize the flow conductance through the particle diffuser), while providing additional surface area for intersecting with particle trajectories in order to cause the break-up of particles and re-evaporation of the particle fragments. For example, the particle diffuser (947a, 947b, 947c) may comprise a screen or mesh. Additionally, for example, the particle diffuser (947a, 947b, 947c) may comprise a honeycomb structure. A honeycomb structure can permit a diffuser design that maximizes the total flow-through area, while permitting the selection of each honeycomb cell diameter and length to maximize wetted surface area.

Figure 10:
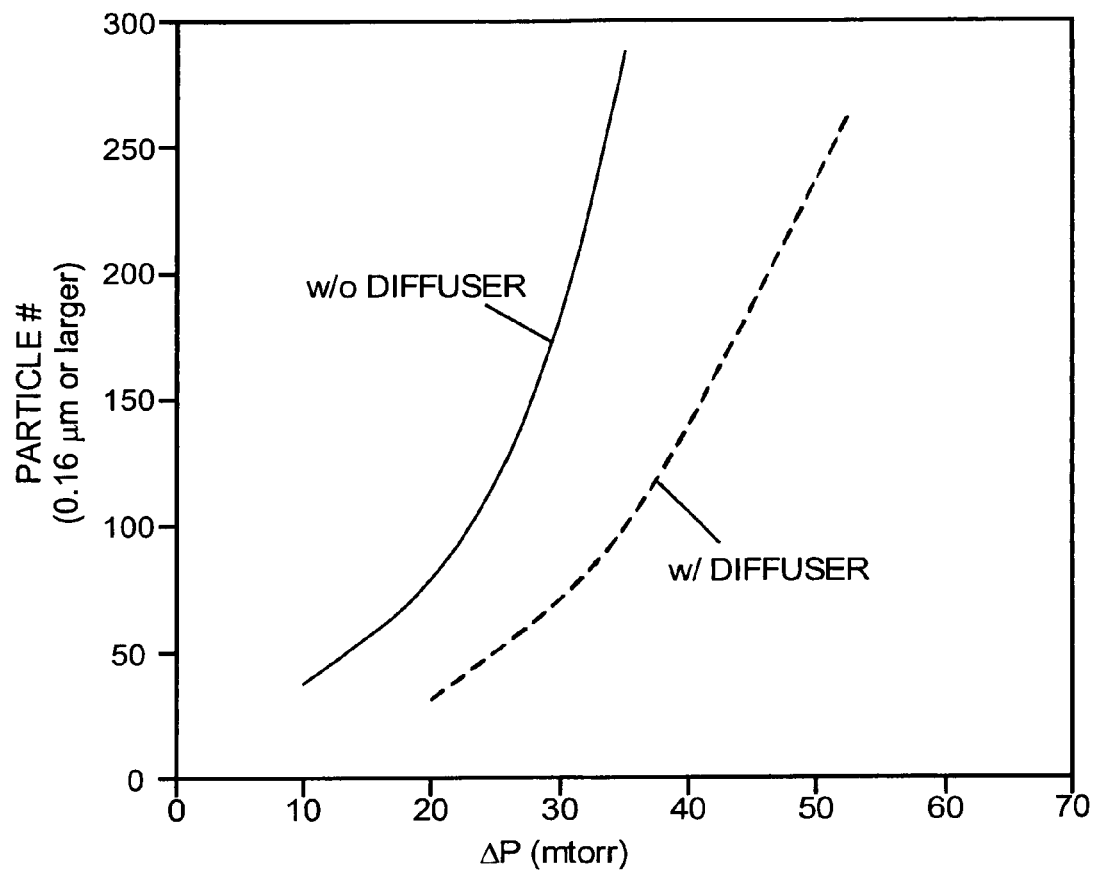
FIG. 10 presents exemplary data illustrating the relationship between particle contamination and change in pressure through the vapor distribution system.

Referring now to FIG. 10, an example of particle reduction is provided for a thin film deposition system. Therein, a ruthenium (Ru) film is deposited using ruthenium carbonyl as a film precursor. In one case (represented by solid line in FIG. 10), no particle diffuser is utilized, and the flow conditions are adjusted such the difference in pressure between the vapor distribution plenum and the process space is varied from approximately 10 mTorr to approximately 50 mTorr. As the difference in pressure is decreased, the number of particles (0.16 micron and larger) found on the processed substrate decreases. In another case (represented by dashed line in FIG. 10), a particle diffuser is located in the inlet to the vapor distribution system (e.g., location 47b in FIG. 1, or location 147b in FIG. 2). As the difference in pressure is decreased, the number of particles (0.16 micron and larger) found on the processed substrate decreases. However, the data (curve) is shifted downwards (i.e., lower particle count), when the particle diffuser is utilized.

For example, the pressure difference ($\Delta P = P_1 - P_2$) can be selected to be less than or equal to approximately 50 mTorr. Alternatively, for example, the pressure difference ($\Delta P = P_1 - P_2$) can be selected to be less than or equal to approximately 30 mTorr. Alternatively, for example, the pressure difference ($\Delta P = P_1 - P_2$) can be selected to be less than or equal to approximately 20 mTorr. Alternatively, for example, the pressure difference ($\Delta P = P_1 - P_2$) can be selected to be less than or equal to approximately 10 mTorr. Alternatively, for example, the pressure ratio ($P_1/P_2$) can be selected to be less than or equal to two.

Figure 11:
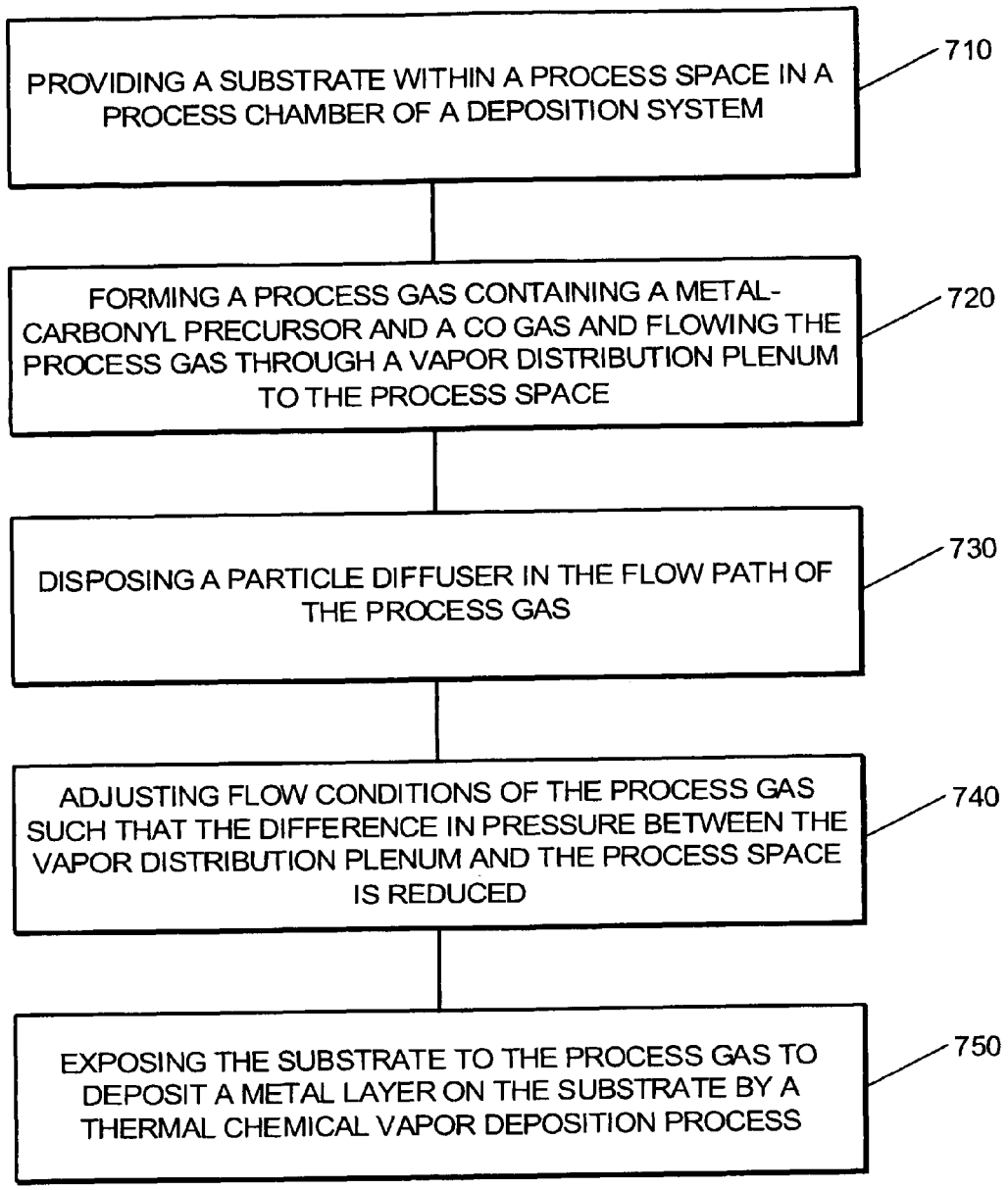
FIG. 11 illustrates a method of depositing a metal layer on a substrate according to an embodiment of the invention.

FIG. 11 illustrates a method of depositing a metal layer on a substrate according to an embodiment of the invention. The method 700 includes, at 710, providing a substrate within a process space in a process chamber of a deposition system. For example, the deposition system can include the depositions systems described above in FIGS. 1 and 2. The substrate can, for example, be a Si substrate. A Si substrate can be of n- or p-type, depending on the type of device being formed. The substrate can be of any size, for example a 200 mm substrate, a 300 mm substrate, or an even larger substrate. According to an embodiment of the invention, the substrate can be a patterned substrate containing one or more vias or trenches, or combinations thereof. At 720, a process gas containing a metal-carbonyl precursor vapor and a CO gas is formed. The process gas can further contain a carrier gas. As described above, according to one embodiment, the metal-carbonyl precursor can be a ruthenium-carbonyl precursor, for example $Ru_3(CO)_{12}$. Addition of the CO gas to the metal-carbonyl precursor vapor allows for increasing the evaporation temperature of metal-carbonyl precursor. The elevated temperature increases the vapor pressure of the metal-carbonyl precursor, resulting in increased delivery of the metal-carbonyl precursor to the process chamber and, hence, increased deposition rate of the metal on a substrate. The process gas is transported to a vapor distribution plenum, wherein the process gas is distributed and introduced to the process space adjacent the substrate.

According to an embodiment of the invention, the process gas can be formed by heating a metal-carbonyl precursor to form the metal-carbonyl precursor vapor, and mixing the CO gas with the metal-carbonyl precursor vapor. According to an embodiment of the invention, the CO gas can be mixed with the metal-carbonyl precursor vapor downstream from the metal-carbonyl precursor. According to another embodiment of the invention, the CO gas can be mixed with the metal-carbonyl precursor vapor by flowing the CO gas over or through the metal-carbonyl precursor. According to yet another embodiment of the invention, the process gas can be formed by additionally flowing a carrier gas over or through the solid metal-carbonyl precursor.

At 730, a particle diffuser is disposed in the flow path of the process gas through the deposition system. For example, one or more particle diffusers are located within the film precursor evaporation system, the vapor delivery system, or the vapor distribution system, or two or more thereof.

At 740, the design of the vapor delivery system, or the vapor distribution system, or both, or the flow conditions are adjusted to reduce the pressure difference (or pressure ratio) between the vapor distribution plenum and the process space in order to affect a reduction in the formation of particles above the substrate.

At 750, the substrate is exposed to the process gas to deposit a metal layer on the substrate by a thermal chemical vapor deposition process. According to an embodiment of the invention, the metal layer can be deposited at a substrate temperature between about 50° C. and about 500° C. Alternately, the substrate temperature can be between about 300° C. and about 400° C.

As would be appreciated by those skilled in the art, each of the steps or stages in the flowchart of FIG. 11 may encompass one or more separate steps and/or operations. Accordingly, the recitation of only five steps in 710, 720, 730, 740, 750 should not be understood to limit the method of the present invention solely to four steps or stages. Moreover, each representative step or stage 710, 720, 730, 740, 750 should not be understood to be limited to only a single process.

Figure 12A:
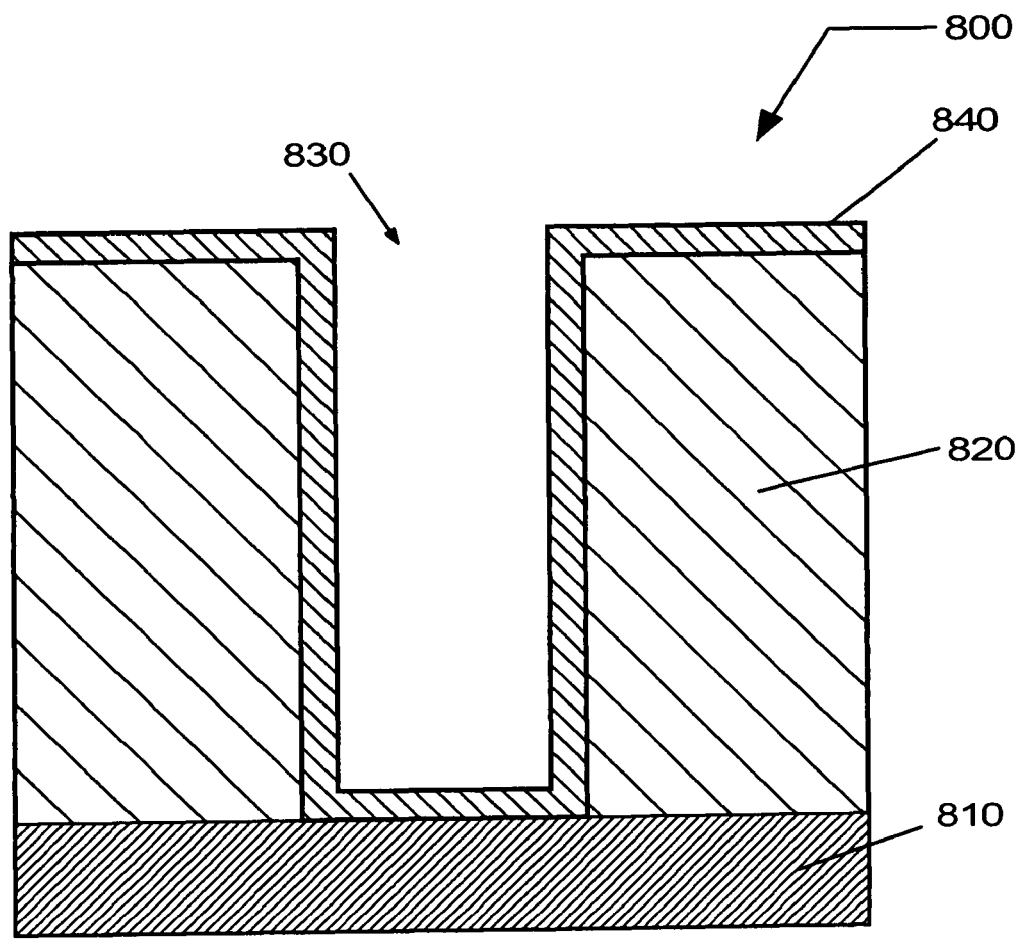
FIGS. 12A through 12C schematically show formation of a metal layer on a patterned substrate according to embodiments of the invention.
Figure 12B:
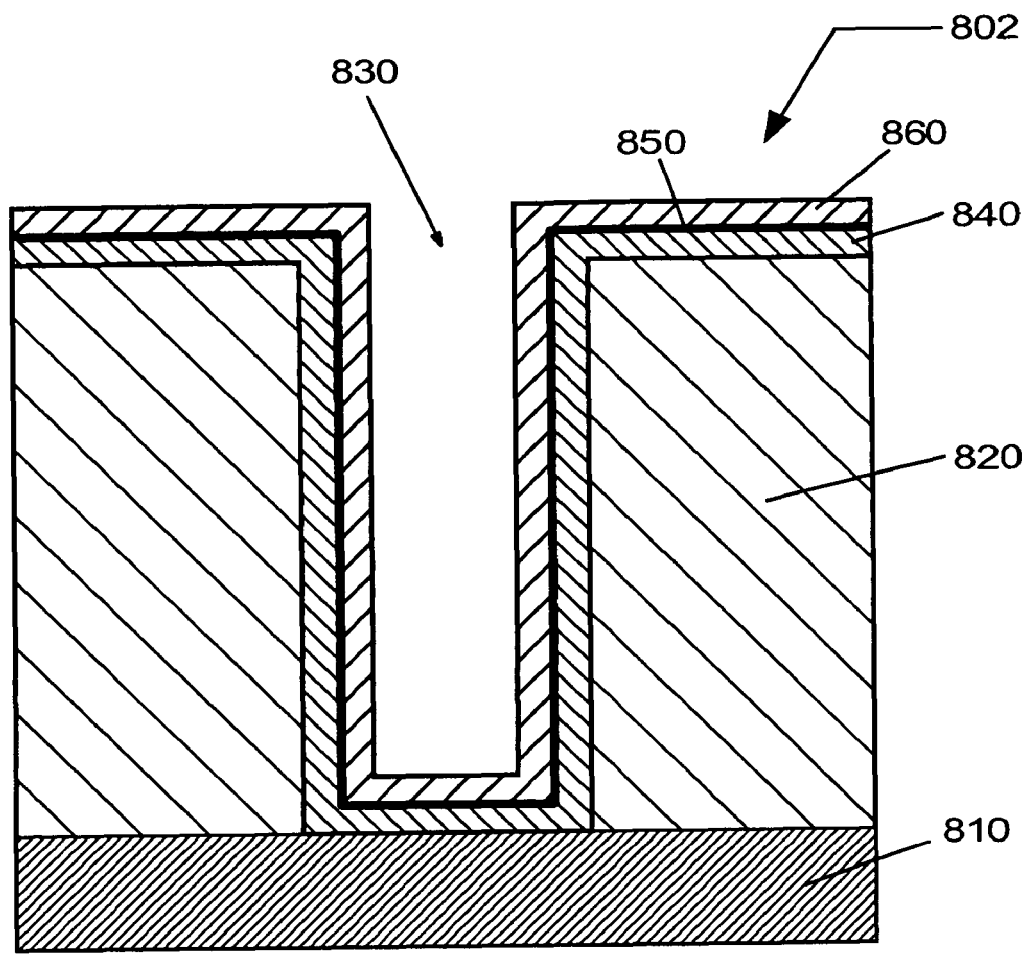
Figure 12C:
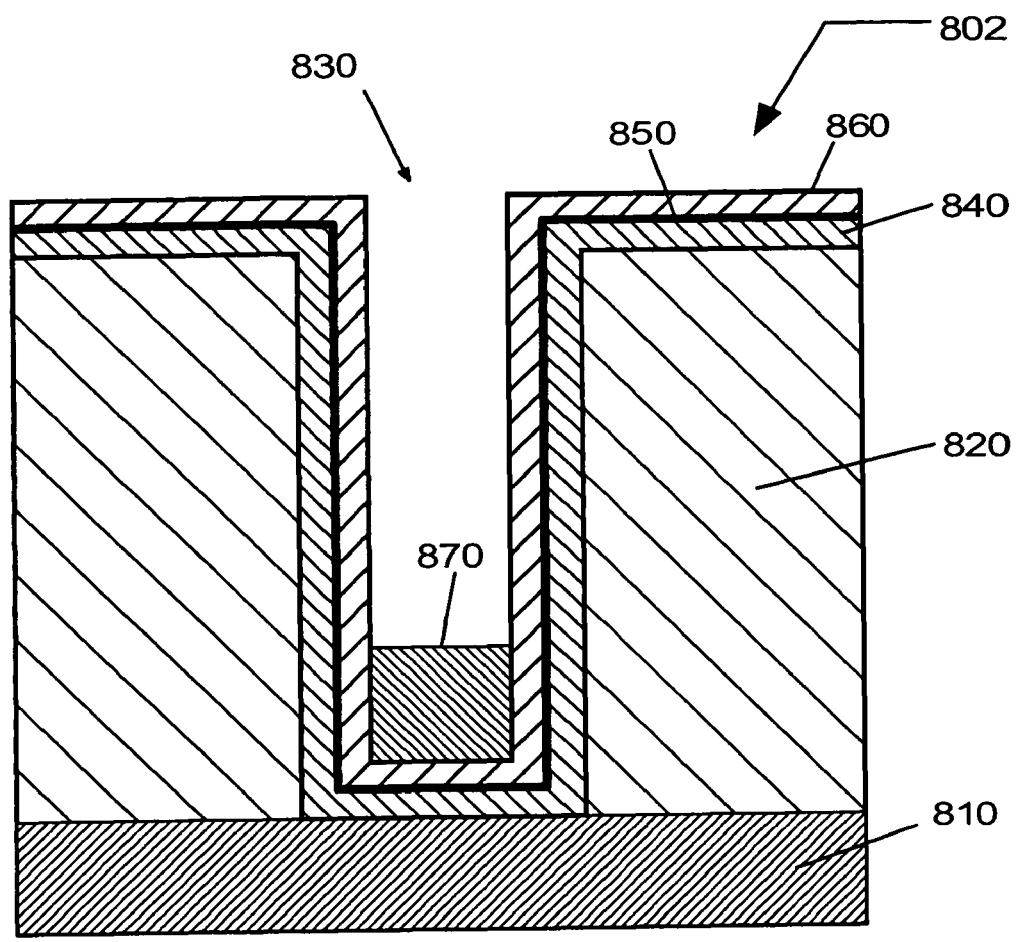

FIGS. 12A through 12C schematically show formation of a metal layer on a patterned substrate according to embodiments of the invention. As those skilled in the art will readily appreciate, embodiments of the invention can be applied to patterned substrates containing one or more vias or trenches, or combinations thereof. FIG. 12A schematically shows deposition of a metal layer 840 onto a patterned structure 800 according to an embodiment of the invention. The patterned structure 800 contains a first metal layer 810, and a patterned layer 820 containing an opening 830. The patterned layer 820 can, for example, be a dielectric material. The opening 830 can, for example, be a via or a trench, and the metal layer 840 can, for example, contain Ru metal.

FIG. 12B schematically shows deposition of a metal layer 860 onto a patterned structure 802 according to another embodiment of the invention. The patterned structure 802 contains a first metal layer 810 and a patterned layer 820 containing an opening 830. A barrier layer 850 is deposited onto the patterned structure 802, and a metal layer 860 is deposited on the barrier layer 850. The barrier layer 850 can, for example, contain a tantalum-containing material (e.g., Ta, TaN, or TaCN, or a combination of two or more thereof) or a tungsten material (e.g., W, WN). The patterned layer 820 can, for example, be a dielectric material. The opening 830 can, for example, be a via or a trench, and the metal layer 860 can, for example, contain Ru metal. FIG. 12C schematically shows deposition of Cu 870 in the opening 830 of FIG. 12B.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. A deposition system for forming a refractory metal film on a substrate, comprising:
a process chamber having a substrate holder configured to support said substrate and heat said substrate; a vapor distribution system comprising a housing having an inlet and a vapor distribution plate coupled to said housing and having a plurality of openings therein, said vapor distribution system configured to introduce metal precursor vapor through said plurality of openings to above said substrate; and a pumping system configured to evacuate said process chamber;
a metal precursor evaporation system configured to evaporate a metal precursor to form a metal precursor vapor;
a vapor delivery system having a first end coupled to an outlet of said metal precursor evaporation system and a second end coupled to said inlet of said housing, said vapor delivery system being characterized by a flow conductance in excess of about 50 liters/second;
a carrier gas supply system coupled to at least one of said metal precursor evaporation system or said vapor delivery system, or both, and configured to supply a carrier gas to transport said metal precursor vapor in said carrier gas through said vapor delivery system to said inlet of said housing; and
one or more particle diffusers disposed within said deposition system along a flow path of said carrier gas and said metal precursor vapor and comprising structure sufficient to break-up particle clusters passing through said diffuser into particle fragments, wherein a net flow conductance through said plurality of openings in said vapor distribution plate is equal to or greater than the flow conductance through said vapor delivery system;
wherein said metal precursor evaporation system comprises one or more precursor trays configured to support said metal precursor, and wherein said one or more particle diffusers are coupled to at least one of said one or more precursor trays above said metal precursor;
wherein said one or more particle diffusers comprise a honeycomb structure.

2. The deposition system of claim 1, wherein said one or more particle diffusers are disposed within said metal precursor evaporation system, said vapor delivery system, or said vapor distribution system, or two or more thereof.

3. The deposition system of claim 1, wherein said one or more particle diffusers are coupled to said outlet of said metal precursor evaporation system.

4. The deposition system of claim 1, wherein said metal precursor evaporation system comprises one or more precursor trays configured to support said metal precursor, and wherein said one or more particle diffusers are coupled to an outlet of at least one of said one or more precursor trays.

5. The deposition system of claim 1, wherein said one or more particle diffusers are coupled to said first end of said vapor delivery system, or said second end of said vapor delivery system, or any location therebetween.

6. The deposition system of claim 1, wherein the combination of said housing and said vapor distribution plate form a plenum configured to receive said carrier gas and said metal precursor vapor and distribute said carrier gas and said metal precursor vapor in said process chamber through said plurality of openings in said vapor distribution plate, and wherein said one or more particle diffusers are disposed within said plenum.

7. The deposition system of claim 1, wherein said one or more particle diffusers comprise a mesh, or a screen.

8. The deposition system of claim 1, wherein said honeycomb structure comprises one or more honeycomb cells, each cell characterized by an effective diameter and a length.

9. The deposition system of claim 1, wherein each of said one or more particle diffusers comprise one or more openings therethrough in order to permit the passage of said carrier gas and said metal precursor vapor, and wherein said one or more openings are substantially aligned with said flow path.

10. The deposition system of claim 1, wherein each of said one or more particle diffusers comprise one or more openings therethrough in order to permit the passage of said carrier gas and said metal precursor vapor, and wherein said one or more openings are angled, or curved relative to said flow path.

11. The deposition system of claim 1, wherein said metal precursor comprises a metal-carbonyl.

12. The deposition system of claim 11, wherein said metal-carbonyl precursor comprises a tungsten-carbonyl, a molybdenum-carbonyl, a cobalt-carbonyl, a rhodium-carbonyl, a rhenium-carbonyl, a chromium-carbonyl, a ruthenium-carbonyl, or an osmium-carbonyl, or a combination of two or more thereof.

13. The deposition system of claim 11, wherein said metal-carbonyl precursor comprises $W(CO)_6$, $Mo(CO)_6$, $Co_2(CO)_8$, $Rh_4(CO)_{12}$, $Re_2(CO)_{10}$, $Cr(CO)_6$, $Ru_3(CO)_{12}$, or $Os_3(CO)_{12}$, or a combination of two or more thereof.

14. The deposition system of claim 1, wherein said one or more particle diffusers are disposed within said vapor delivery system.

15. The deposition system of claim 1, wherein said one or more particle diffusers comprises a honeycomb structure disposed within said vapor delivery system, said honeycomb structure having one or more honeycomb cells aligned in a direction that is angled with respect to said flow path.

16. The deposition system of claim 1, wherein said structure is configured to provide surfaces intersecting with particle trajectories so as to cause said break-up of particle clusters and re-evaporation of said particle fragments.

17. The deposition system of claim 16, wherein said one or more particle diffusers comprise a mesh or a screen.

18. The deposition system of claim 1, wherein said one or more particle diffusers has a honeycomb structure having a plurality of honeycomb cells having a diameter and length to maximize wetted surface area.

* * * * *